(12) United States Patent
Kim et al.

(10) Patent No.: US 11,758,713 B2
(45) Date of Patent: Sep. 12, 2023

(54) SEMICONDUCTOR DEVICES

(71) Applicant: SAMSUNG ELECTRONICS CO., LTD., Suwon-si (KR)

(72) Inventors: Dongoh Kim, Daegu (KR); Gyuhyun Kil, Hwaseong-si (KR); Junghoon Han, Hwaseong-si (KR); Doosan Back, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/386,008

(22) Filed: Jul. 27, 2021

(65) Prior Publication Data

US 2022/0189969 A1 Jun. 16, 2022

(30) Foreign Application Priority Data

Dec. 15, 2020 (KR) ........................ 10-2020-0175579

(51) Int. Cl.
*H10B 12/00* (2023.01)
*H01L 27/092* (2006.01)

(52) U.S. Cl.
CPC ........... *H10B 12/50* (2023.02); *H01L 27/092* (2013.01); *H10B 12/315* (2023.02)

(58) Field of Classification Search
CPC ............. H01L 27/10897; H01L 27/092; H01L 27/10814; H01L 27/0922; H01L 21/823878; H01L 21/823807; H01L 21/823828; H01L 21/76224; H01L 21/823857
See application file for complete search history.

(56) References Cited

U.S. PATENT DOCUMENTS

| | | | |
|---|---|---|---|
| 6,682,986 B2 * | 1/2004 | Kim | H01L 21/76235 438/426 |
| 8,455,960 B2 | 6/2013 | Jakubowski et al. | |
| 8,716,828 B2 | 5/2014 | Carter et al. | |
| 8,759,183 B2 * | 6/2014 | Heo | H01L 21/823456 257/E21.409 |
| 8,916,433 B2 | 12/2014 | Scheiper et al. | |
| 10,541,302 B2 | 1/2020 | Yoon et al. | |
| 2018/0175143 A1 | 6/2018 | Yoon et al. | |
| 2019/0326278 A1 * | 10/2019 | Lee | H01L 21/823807 |

* cited by examiner

*Primary Examiner* — Edward Chin
(74) *Attorney, Agent, or Firm* — Lee IP Law, P.C.

(57) ABSTRACT

A semiconductor device includes first and second trenches in respective first and second regions in a substrate, a first isolation structure having a first inner wall oxide pattern, a first liner, and a first filling insulation pattern sequentially stacked I the first trench, a second isolation structure having a second inner wall oxide pattern, a second liner, and a second filling insulation pattern sequentially stacked I the second trench, a first gate structure having a first high-k dielectric pattern, a first P-type metal pattern, and a first N-type metal pattern sequentially stacked on the first region, and a second gate structure having a second high-k dielectric pattern and a second N-type metal pattern sequentially stacked on the second region, wherein the first and second liners protrude above upper surfaces of the first and second inner wall oxide patterns and the first and second filling insulation patterns, respectively.

20 Claims, 25 Drawing Sheets

SEMICONDUCTOR DEVICES

CROSS-REFERENCE TO RELATED APPLICATION

Korean Patent Application No. 10-2020-0175579, filed on Dec. 15, 2020, in the Korean Intellectual Property Office, and entitled: "Semiconductor Devices," is incorporated by reference herein in its entirety.

BACKGROUND

1. Field

Example embodiments relate to a semiconductor device. More particularly, example embodiments relate to a semiconductor device including transistors.

2. Description of the Related Art

A semiconductor device may include a plurality of transistors. The transistors included in the semiconductor device may have various structures according to required electrical performance, e.g., an operating voltage and/or driving currents. For example, an NMOS transistor and a PMOS transistor may have different stacked structures. For an isolation between NMOS transistors and an isolation between PMOS transistors, isolation structures may be formed at a substrate.

SUMMARY

According to example embodiments, there is provided a semiconductor device that may include a first trench formed at a substrate of a first region, a second trench formed at the substrate of a second region, a first isolation structure filling the first trench, a second isolation structure filling the second trench, a first gate structure formed on the substrate of the first region, and a second gate structure formed on the substrate of the second region. The first isolation structure may include a first inner wall oxide pattern, a first liner, and a first filling insulation pattern sequentially stacked. The second isolation structure may include a second inner wall oxide pattern, a second liner, and a second filling insulation pattern sequentially stacked. The first gate structure may include a first high-k dielectric pattern, a first P-type metal pattern, and a first N-type metal pattern sequentially stacked. The second gate structure may include a second high-k dielectric pattern and a second N-type metal pattern sequentially stacked. The first inner wall oxide pattern and the first liner may be conformally on a surface of the first trench. The first liner may protrude from upper surfaces of the first inner wall oxide pattern and the first filling insulation pattern. The second inner wall oxide pattern and the second liner may be conformally on a surface of the second trench. The second liner may protrude from upper surfaces of the second inner wall oxide pattern and the second filling insulation pattern.

According to example embodiments, there is provided a semiconductor device that may include a substrate including a cell array region, a first peripheral region, and a second peripheral region, memory cells on the substrate of the cell array region, trenches formed at the substrate of the first and second peripheral regions, an isolation structure filling each of the trenches, a channel layer on the substrate of the first peripheral region, a first gate structure formed on the channel layer, and a second gate structure formed on the substrate of the second peripheral region. The isolation structure may include an inner wall oxide pattern, a nitride liner, and a filling insulation pattern sequentially stacked. The channel layer may include silicon germanium. The first gate structure may include a first high-k dielectric pattern, a first P-type metal pattern, and a first N-type metal pattern sequentially stacked. The second gate structure may include a second high-k dielectric pattern and a second N-type metal pattern sequentially stacked. The inner wall oxide pattern and the nitride liner may be conformally on surfaces of the trenches. The nitride liner may protrude from upper surfaces of the inner wall oxide pattern and the filling insulation pattern.

According to example embodiments, there is provided a semiconductor device that may include a substrate including a cell array region, a first peripheral region, a second peripheral region, a third peripheral region, and a fourth peripheral region, memory cells on the substrate of the cell array region, trenches at the substrate of the first to fourth peripheral regions, an isolation structure filling each of the trenches, a channel layer on the substrate of the first peripheral region, a first gate structure formed on the channel layer, a second gate structure formed on the substrate of the second peripheral region, a third gate structure formed on the substrate of the third peripheral region, and a fourth gate structure formed on the substrate of the fourth peripheral region. The isolation structure may include an inner wall oxide pattern, a nitride liner, and a filling insulation pattern sequentially stacked. The channel layer may include silicon germanium. The first gate structure may include a first interface insulation pattern, a first high-k dielectric pattern, a first P-type metal pattern, and a first N-type metal pattern sequentially stacked. The second gate structure may include a second interface insulation pattern, a second high-k dielectric pattern, a second P-type metal pattern, and a second N-type metal pattern sequentially stacked. A thickness of the second interface insulation pattern may be greater than a thickness of the first interface insulation pattern, The third gate structure may include a third interface insulation pattern, a third high-k dielectric pattern, and a third N-type metal pattern sequentially stacked. The fourth gate structure may include a fourth interface insulation pattern, a fourth high-k dielectric pattern, and a fourth N-type metal pattern sequentially stacked. The nitride liner may be conformally on the surfaces of the trenches. The nitride liner may protrude from upper surfaces of the inner wall oxide pattern and the filling insulation pattern. Heights of uppermost surfaces of the nitride liners are substantially the same.

BRIEF DESCRIPTION OF THE DRAWINGS

Features will become apparent to those of skill in the art by describing in detail exemplary embodiments with reference to the attached drawings, in which.

DETAILED DESCRIPTION

Figure 1:
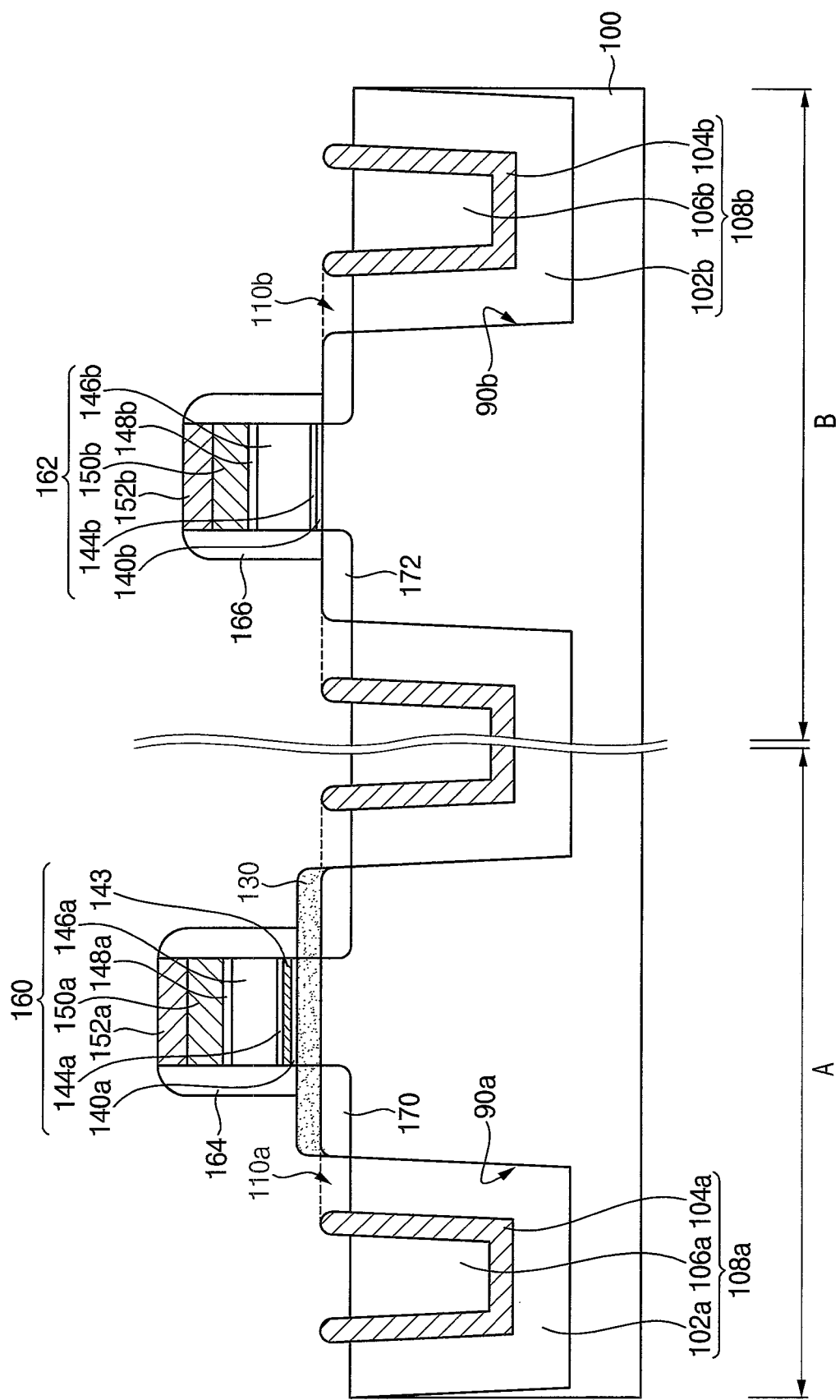
FIG. 1 is a cross-sectional view of a semiconductor device in accordance with example embodiments.

FIG. 1 is a cross-sectional view of a semiconductor device in accordance with example embodiments.

Referring to FIG. 1, a substrate 100 may include a first region A and a second region B. The substrate 100 may be, e.g., a single crystal silicon substrate or a silicon on insulator (SOI) substrate. The first region A may be a PMOS transistor region, and the second region B may be an NMOS transistor region.

A first trench 90a may be formed in the substrate 100 in the first region A, and a second trench 90b may be formed in the substrate 100 in the second region B. A first isolation structure 108a may be formed in the first trench 90a, and a second isolation structure 108b may be formed in the second trench 90b. In the substrate 100, a region in which the first and second isolation structures 108a and 108b are disposed may serve as a field region. A region of the substrate 100 between the first and second isolation structures 108a and 108b may serve as an active region.

The first isolation structure 108a may include a first inner wall oxide pattern 102a, a first liner 104a, and a first filling insulation pattern 106a. The first inner wall oxide pattern 102a may be conformally formed on a surface of the first trench 90a, and the first liner 104a may be conformally formed on the first inner wall oxide pattern 102a. The first filling insulation pattern 106a may be formed on the first liner 104a to fill the first trench 90a.

The second isolation structure 108b may include a second inner wall oxide pattern 102b, a second liner 104b, and a second filling insulation pattern 106b. The second inner wall oxide pattern 102b may be conformally formed on a surface of the second trench 90b, and the second liner 104b may be conformally formed on the second inner wall oxide pattern 102b. The second filling insulation pattern 106b may be formed on the second liner 104b to fill the second trench 90b.

The first and second inner wall oxide patterns 102a and 102b may be formed by the same deposition process, and thus the first and second inner wall oxide patterns 102a and 102b may include the same material. For example, the first and second inner wall oxide patterns 102a and 102b may include silicon oxide. The first liner 104a and the second liner 104b may be formed by the same deposition process, and thus the first liner 104a and the second liner 104b may include the same material. For example, the first liner 104a and the second liner 104b may include silicon nitride. The first and second filling insulation patterns 106a and 106b may be formed by the same deposition process, and thus the first and second filling insulation patterns 106a and 106b may include the same material. For example, the first and second filling insulation patterns 106a and 106b may include silicon oxide.

In example embodiments, a thickness (i.e., a thickness in a vertical direction from the surface of the trench) of the first inner wall oxide pattern 102a may be greater than a thickness of the first liner 104a. A thickness of the second inner wall oxide pattern 102b may be greater than a thickness of the second liner 104b.

In example embodiments, each of the first and second inner wall oxide patterns 102a and 102b may have the thickness of about 200 angstroms or more. For example, each of the first and second inner wall oxide patterns 102a and 102b may have a thickness of about 250 angstroms to about 400 angstroms. If the thickness of each of the first and second inner wall oxide patterns 102a and 102b is less than 200 angstroms, an inner width of each of first and second recessed portions 110a and 110b subsequently described may be decreased.

In the first isolation structure 108a, the first liner 104a may protrude from, e.g., above, upper surfaces of the first inner wall oxide pattern 102a and the first filling insulation pattern 106a. That is, an uppermost surface of the first liner 104a may be higher than uppermost surfaces of the first inner wall oxide pattern 102a and the first filling insulation pattern 106a, e.g., relative to a bottom of the substrate 100. A first recessed portion 110a may be formed, e.g., defined, between the first liner 104a and the substrate 100 adjacent thereto. For example, as illustrated in FIG. 1, since the first liner 104a and a portion of the substrate 100 (e.g., an impurity region 170 in a top portion of the substrate 100) protrude above the upper surface of the first inner wall oxide pattern 102a from opposite sides thereof, the first recessed portion 110a may be defined on the upper surface of the first inner wall oxide pattern 102a between the protruding portions of the first liner 104a and the substrate 100 (e.g., under dashed line in FIG. 1).

In example embodiments, the uppermost surface of the first filling insulation pattern 106a may be substantially coplanar with the uppermost surface of the first inner wall oxide pattern 102a, or may be lower than the uppermost surface of the first inner wall oxide pattern 102a.

In example embodiments, the inner width of the first recessed portion 110a, e.g., a distance between directly facing surfaces of the first liner 104a and the substrate 100 along a horizontal direction parallel to the bottom of the substrate 100, may be greater than a height from a bottom of the first recessed portion 110a to the uppermost surface of the first liner 104a. In example embodiments, the bottom of the first recessed portion 110a may be substantially flat, e.g., the upper surface of the first inner wall oxide pattern 102a defining the bottom of the first recessed portion 110a may be substantially flat. That is, a central portion of the bottom of the first recessed portion 110a may not have a rounded shape, and the bottom of the first recessed portion 110a may have a flat surface, e.g., an entire bottom surface of the first recessed portion 110 defined by the upper surface of the first inner wall oxide pattern 102a may be level and parallel to the bottom surface of the substrate 100.

As such, an aspect ratio of the first recessed portion 110a may be decreased, and the inner width of the first recessed portion 110a may be increased. Therefore, metal layers deposited in the first recessed portion 110a may be easily removed in processing for manufacturing the semiconductor device. Thus, the metal layers may not remain in the first recessed portion 110a. Accordingly, defects (e.g., a bridge failure between gates) due to remains or residue of removed metal layers in the first recessed portion 110a may be decreased.

The second isolation structure 108b may have a shape and a structure similar to a shape and a structure of the first isolation structure 108a. That is, in the second isolation structure 108b, the second liner 104b may protrude from, e.g., above, upper surfaces of the second inner wall oxide pattern 102b and the second filling insulation pattern 106b. The uppermost surface of the second liner 104b may be higher than the uppermost surfaces of the second inner wall oxide pattern 102b and the second filling insulation pattern 106b, so a second recessed portion 110b may be formed between the second liner 104b and the substrate 100 adjacent thereto. In example embodiments, the uppermost surface of the second filling insulation pattern 106b may be substantially coplanar with the uppermost surface of the second inner wall oxide pattern 102b, or may be lower than the uppermost surface of the second inner wall oxide pattern 102b.

In example embodiments, the inner width of the second recessed portion 110b may be greater than a height from a bottom of the second recessed portion 110b to the uppermost surface of the second liner 104b. In example embodiments, the bottom of the second recessed portion 110b may be substantially flat. That is, a central portion of the bottom of the second recessed portion 110b may not have a rounded shape, and the bottom of the second recessed portion 110b may have a flat surface.

In example embodiments, in the first and second isolation structures 108a and 108b, heights (e.g., vertical levels relative to the bottom of the substrate 100) of the uppermost surfaces of the first and second liners 104a and 104b including silicon nitride may be substantially the same. For example, in the first and second isolation structures 108a and 108b, the uppermost surfaces of the first and second liners 104a and 104b including silicon nitride may be substantially coplanar with an upper surface of a portion of the substrate adjacent to the first and second liners 104a and 104b.

In example embodiments, the uppermost surface of the first inner wall oxide pattern 102a may be lower than the upper surface of the substrate 100 adjacent to the first trench 90a, and the uppermost surface of the second inner wall oxide pattern 102b may be lower than the upper surface of the substrate 100 adjacent to the second trench 90b. The uppermost surface of the first inner wall oxide pattern 102a and the uppermost surface of the second inner wall oxide pattern 102b may be substantially coplanar with each other.

In example embodiments, a vertical level of the bottom of the second recessed portion 110b may be substantially the same as a vertical level of the bottom of the first recessed portion 110a. Further, a height of a protruding portion of the first liner 104a may be substantially the same as a height of a protruding portion of the second liner 104b.

A channel layer 130 may be formed on the substrate 100 of the first region A. A lattice constant of the channel layer 130 may be greater than a lattice constant of the substrate 100. For example, the channel layer 130 may include silicon germanium.

Hole mobility of a PMOS transistor formed on the channel layer 130 may be increased by the channel layer 130. Further, a threshold voltage of the PMOS transistor may be controlled by controlling a work function of the channel layer 130. For example, the channel layer 130 may have a low work function, so that the PMOS transistor may have a target threshold voltage. A first gate structure 160 may be formed on the channel layer 130.

First impurity regions 170 serving as first source/drain regions may be formed at the channel layer 130 and the substrate 100 adjacent to both sides of the first gate structure 160. The first impurity regions 170 may be doped with impurities, e.g., P-type impurities.

A second gate structure 162 may be formed on the substrate 100 of the second region B. Second impurity regions 172 serving as second source/drains may be formed in the substrate 100 adjacent to both sides of the second gate structure 162. The second impurity regions 172 may be doped with impurities, e.g., N-type impurities.

The first gate structure 160 may include a first interface insulation pattern, a first high-k dielectric pattern 140a, a first P-type metal pattern 143, a first N-type metal pattern 144a, a first lower electrode 146a, a first barrier pattern 148a, a first upper electrode 150a, and a first capping layer pattern 152a sequentially stacked. The second gate structure 162 may include a second interface insulation pattern, a second high-k dielectric pattern 140b, a second N-type metal pattern 144b, a second lower electrode 146b, a second barrier pattern 148b, a second upper electrode 150b, and a second capping layer pattern 152b sequentially stacked.

That is, the first gate structure 160 may include the first P-type metal pattern 143 and the first N-type metal pattern 144a sequentially stacked, while the second gate structure 162 may include the second N-type metal pattern 144b (i.e., without a p-type metal pattern). Except for stacking of the P-type metal pattern and the N-type metal pattern, stacked structures of the first and second gate structures 160 and 162 may be the same.

As the P-type metal pattern is not included in the second gate structure 162, a thickness of the first gate structure 160 may be greater than a thickness of the second gate structure 162, e.g., in the vertical direction along a normal to the bottom of the substrate 100. That is, the first gate structure 160 may have a first thickness, and the second gate structure 162 may have a second thickness less than the first thickness.

The first and second interface insulation patterns may include, e.g., silicon oxide or silicon oxynitride. The first high-k dielectric pattern 140a and the second high-k dielectric pattern 140b may include a metal oxide having a dielectric constant higher than a dielectric constant of silicon oxide. For example, The first high-k dielectric pattern 140a and the second high-k dielectric pattern 140b may include at least one of hafnium oxide (HfO), hafnium silicate (HfSiO), hafnium oxide nitride (HfON), hafnium silicon oxynitride (HfSiON), lanthanum oxide (LaO), lanthanum aluminum oxide, (LaAlO), zirconium oxide (ZrO), Zirconium silicate (ZrSiO), zirconium oxide nitride (ZrON), zirconium silicon oxynitride (ZrSiON), tantalum oxide (TaO), titanium oxide (TiO), barium strontium titanium oxide (BaSrTiO), barium titanium oxide (BaTiO), strontium titanium oxide (SrTiO), yttrium oxide (YO), aluminum oxide ($Al_2O_3$), and lead scandium tantalum oxide (PbScTaO). For example, the first and second high-k dielectric patterns 140a and 140b may include $HfO_2$, $Al_2O_3$, $HfAlO_3$, $Ta_2O_3$, or $TiO_2$.

The first P-type metal pattern 143 may include a metal material having P-work function. In example embodiments, the first P-type metal pattern 143 may include at least one of aluminum, aluminum oxide, titanium nitride, tungsten nitride, and ruthenium oxide. For example, the first P-type metal pattern 143 may include a stacked structure including a titanium nitride layer, an aluminum layer, and a titanium nitride layer or a stacked structure including a titanium nitride layer, an aluminum oxide layer, and a titanium nitride layer.

The first N-type metal pattern 144a and the second N-type metal pattern 144b may include a metal having an N-work function. In example embodiments, the N-type metal pattern 25 may include at least one of lanthanum (La), lanthanum oxide (LaO), tantalum (Ta), tantalum nitride (TaN), niobium (Nb), and titanium nitride (TiN). For example, each of the first and second N-type metal patterns 144a and 144b may include a stacked structure including a lanthanum layer and a titanium nitride layer or a stacked structure including a lanthanum oxide layer and a titanium nitride layer.

The first lower electrode 146a and the second lower electrode 146b may include polysilicon doped with impurities. The first lower electrode 146a may be doped with P-type impurities, and the second lower electrode 146b may be doped with N-type impurities.

The first and second barrier patterns 148a and 148b may include, e.g., titanium nitride, tungsten nitride, or tantalum nitride.

The first upper electrode 150a and the second upper electrode 150b may include a metal. The first upper electrode 150a may include, e.g., a metal silicide layer, a metal nitride layer, or a metal layer. The metal silicide may include, e.g., cobalt silicide or tungsten silicide. The metal nitride layer may include, e.g., a titanium nitride layer or a tantalum nitride layer. The metal layer may include, e.g., tungsten.

The first and second capping layer patterns 152a and 152b may include, e.g., silicon nitride. A first spacer 164 may be formed on a sidewall of the first gate structure 160. A second spacer 166 may be formed on a sidewall of the second gate structure 162. The first and second spacers 164 and 166 may include, e.g., silicon oxide and/or silicon nitride.

In the semiconductor device, the first and second isolation structures 108a and 108b may include first and second liners 104a and 104b having protruding portions, respectively, that define first and second recessed portions 110a and 110b adjacent to the first and second gate structures 160 and 162, respectively. However, during manufacturing, metal material may not remain in the first and second recessed portions 110a and 110b due to increased width thereof. Therefore, in the semiconductor device, potential defects caused by residual metal materials in the first and second recessed portions 110a and 110b may be decreased.

Figure 2:
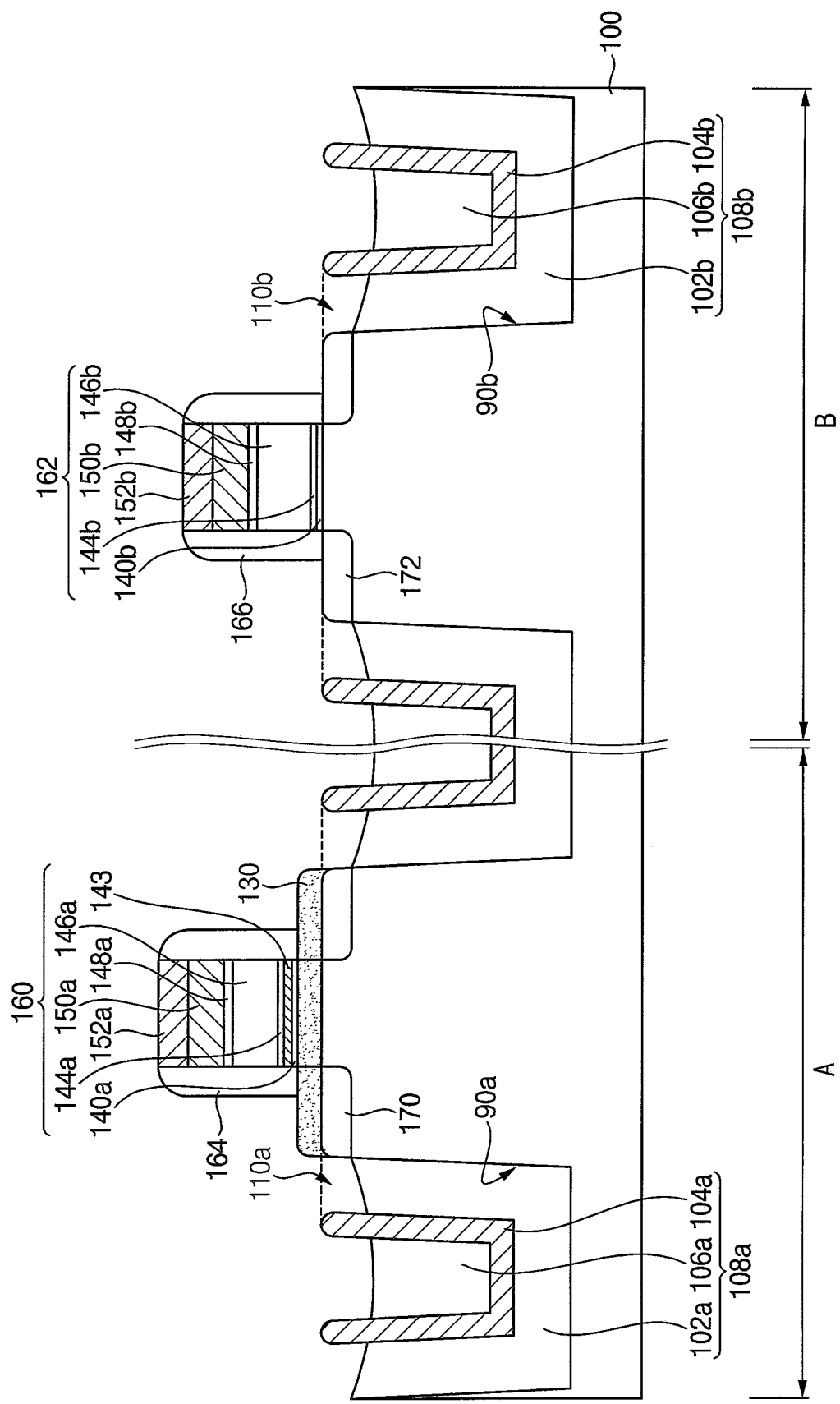
FIG. 2 is a cross-sectional view of a semiconductor device in accordance with example embodiments.

FIG. 2 is a cross-sectional view illustrating a semiconductor device in accordance with example embodiments. The semiconductor device in FIG. 2 is substantially the same as the semiconductor device described with reference to FIG. 1, except for shapes of the first and second isolation structures.

Referring to FIG. 2, a bottom of each of the first and second recessed portions 110a and 110b may have a slope with respect to a flat upper surface of the substrate 100, e.g., the bottom of each of the first and second recessed portions 110a and 110b may be inclined at an oblique angle with respect to the bottom of the substrate 100. A central portion of the bottom of each of the first and second recessed portions 110a and 110b may not have a rounded shape.

In example embodiments, an uppermost surface of the first filling insulation pattern 106a may be substantially coplanar with an upper surface of the first inner wall oxide pattern 102a, or may be lower than the upper surface of the first inner wall oxide pattern 102a. In example embodiments, an uppermost surface of the second filling insulation pattern 106b may be substantially coplanar with an upper surface of the second inner wall oxide pattern 102b, or may be lower than the upper surface of the second inner wall oxide pattern 102b.

Figure 3:
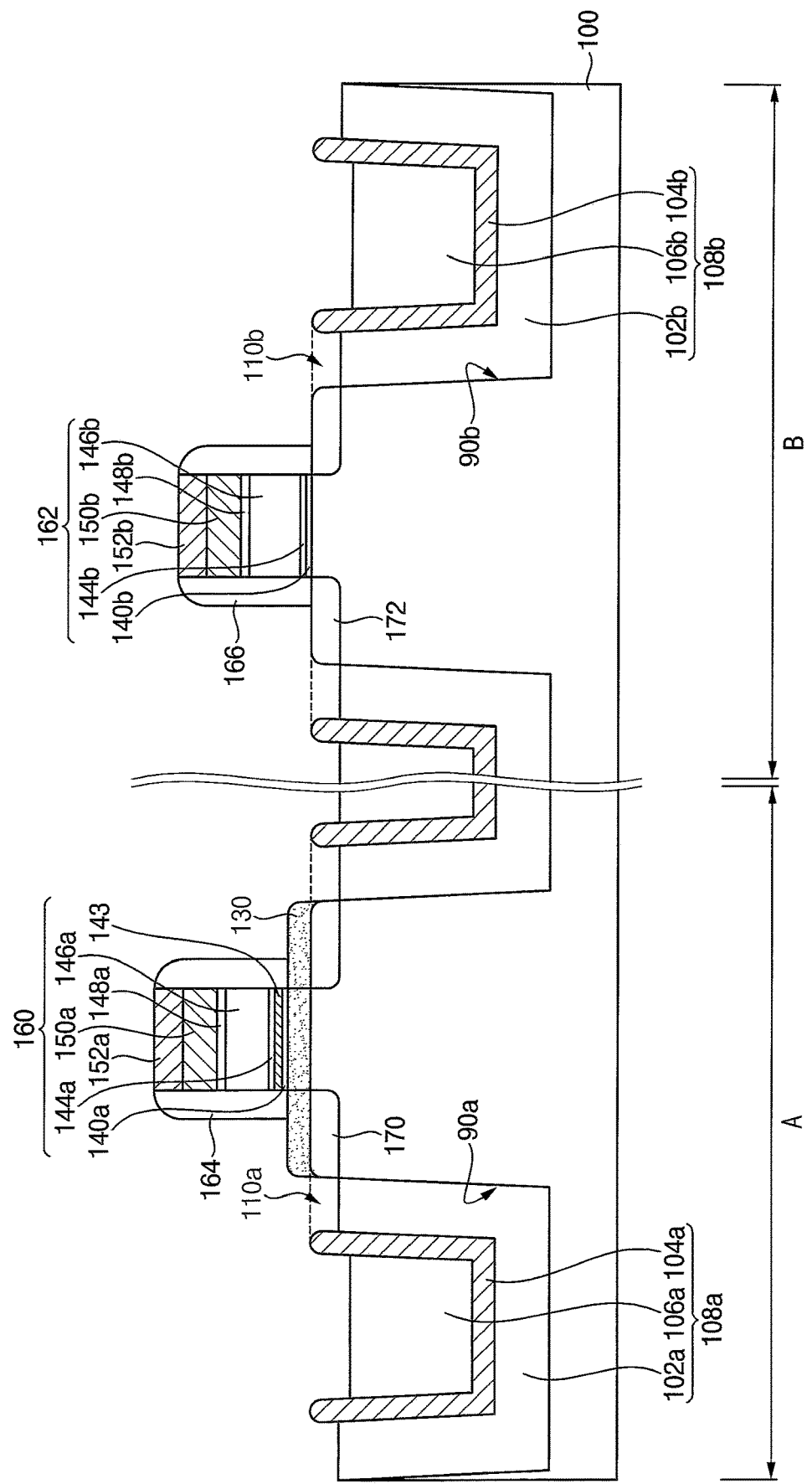
FIG. 3 is a cross-sectional view of a semiconductor device in accordance with example embodiments.

FIG. 3 is a cross-sectional view illustrating a semiconductor device in accordance with example embodiments. The semiconductor device in FIG. 3 is substantially the same as the semiconductor device described with reference to FIG. 1, except for shapes of the first and second isolation structures.

Referring to FIG. 3, a width of the first filling insulation pattern 106a, e.g., as measured between directly facing surfaces of the first liner 104a, may be greater than a width of the first inner wall oxide pattern 102a. In example embodiments, the width of the first filling insulation pattern 106a may be greater than twice the width of the first inner wall oxide pattern 102a. The width of the first inner wall oxide pattern 102a may be a thickness of the first inner wall oxide pattern 102a in the vertical direction from a sidewall of the first trench 90a, e.g., the width of the first inner wall oxide pattern 102a may be a distance between directly facing surfaces of the first inner wall oxide pattern 102a and the sidewall of the first trench 90a along a horizontal direction parallel to the bottom of the substrate 100.

When the width of the first filling insulation pattern 106a is greater than the width of the first inner wall oxide pattern 102a, the first filling insulation pattern 106a may be easily exposed to an etching gas during an etching process. Thus, an amount of etching of the first filling insulation pattern 106a may increase, so that an uppermost surface of the first filling insulation pattern 106a may be lower than an uppermost surface of the first inner wall oxide pattern 102a, e.g., relative to the bottom of the substrate 100.

A width of the second filling insulation pattern 106b may be greater than a width of the second inner wall oxide pattern 102b. In this case, an uppermost surface of the second filling insulation pattern 106b may be lower than an uppermost surface of the second inner wall oxide pattern 102b. In example embodiments, the width of the second filling insulation pattern 106b may be greater than twice the width of the second inner wall oxide pattern 102b.

FIGS. 4 to 16 are cross-sectional views of stages in a method of manufacturing a semiconductor device in accordance with example embodiments.

Figure 4:
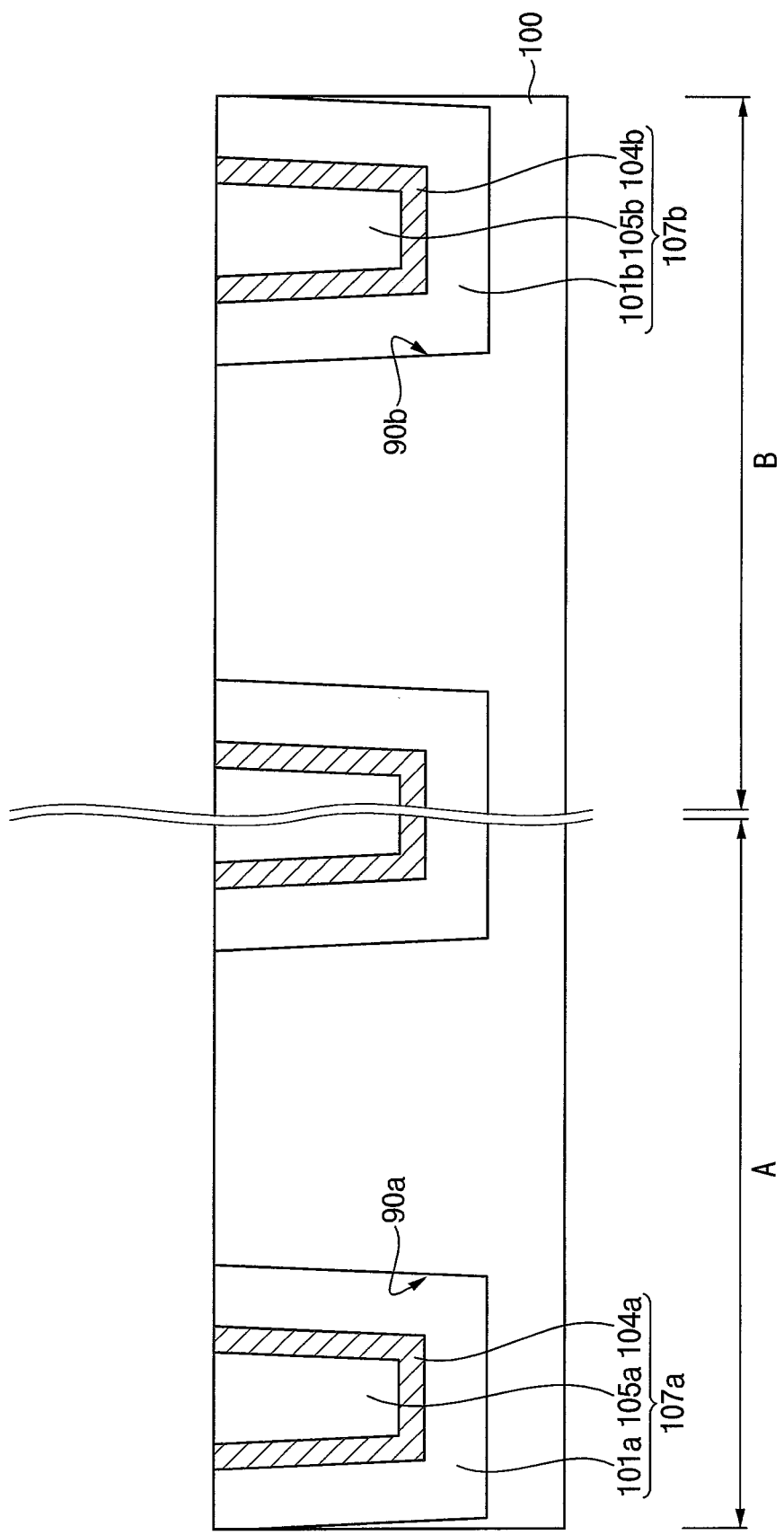
FIGS. 4 to 16 are cross-sectional views of stages in a method of manufacturing a semiconductor device in accordance with example embodiments.

Referring to FIG. 4, the substrate 100 may include the first region A and the second region B. A portion of the substrate 100 may be etched to form the first and second trenches 90a and 90b. The first trench 90a may be formed in a portion of the substrate 100 of the first region A, and the second trench 90b may be formed in a portion of the substrate 100 of the second region B.

An inner wall oxide layer may be conformally formed on an upper surface of the substrate 100 and surfaces of the first and second trenches 90a and 90b. A liner layer may be formed on the inner wall oxide layer. The inner wall oxide layer may be formed to have a thickness greater than a thickness of the liner layer. The inner wall oxide layer may have a thickness of 200 angstroms or more, e.g., the inner wall oxide layer may have a thickness of about 250 angstroms to about 400 angstroms.

In example embodiments, the inner wall oxide layer may include silicon oxide. The inner wall oxide layer may be formed by a thermal oxidation process and/or a deposition process. In example embodiments, the liner layer may include silicon nitride. The liner layer may be formed by a deposition process.

A filling insulation layer may be formed on the liner layer to fill the first and second trenches 90a and 90b. The filling insulation layer may include silicon oxide. The filling insulation layer may be formed by a deposition process.

Thereafter, the filling insulation layer, the liner layer, and the inner wall oxide layer may be planarized until an upper surface of the substrate 100 is exposed to form a preliminary first isolation structure 107a and a preliminary second isolation structure 107b. The preliminary first isolation structure 107a may be formed in the first trench 90a, and the preliminary second isolation structure 107b may be formed in the second trench 90b.

The preliminary first isolation structure 107a may include a preliminary first inner wall oxide pattern 101a, the first liner 104a, and a preliminary first filling insulation layer pattern 105a. The preliminary second isolation structure 107b may include a preliminary second inner wall oxide pattern 101b, the second liner 104b, and a preliminary second filling insulation layer pattern 105b.

Figure 5:
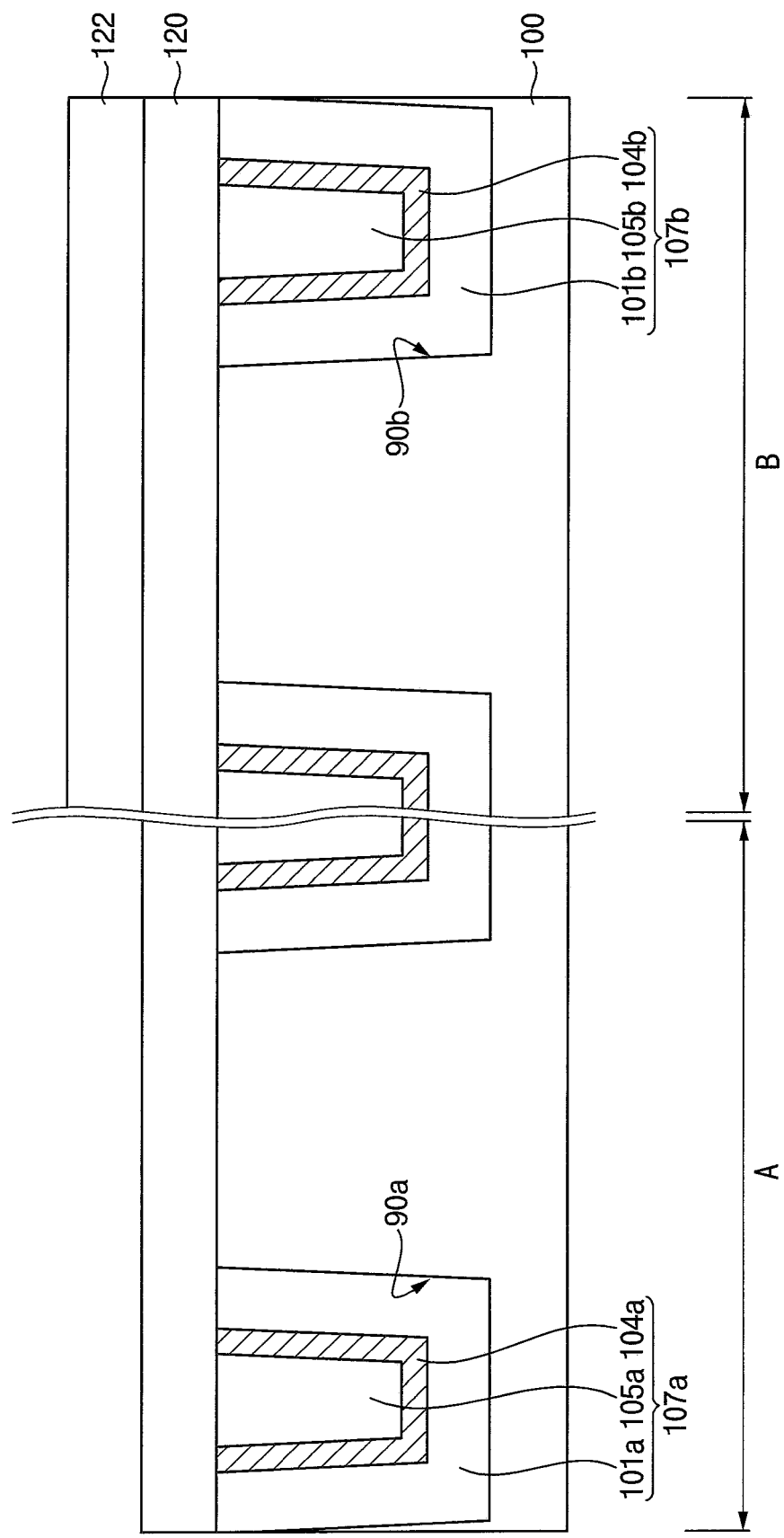

Referring to FIG. 5, a first mask layer 120 may be formed to cover the substrate 100 and the preliminary first and second isolation structures 107a and 107b. The first mask layer 120 may be a silicon oxide layer. For example, the first mask layer 120 may include TEOS (Tetra Ethyl Ortho Silicate) material.

A first photoresist pattern 122 may be formed on the first mask layer 120. The first photoresist pattern 122 may cover the second region B, and may expose the first region A.

Figure 6:
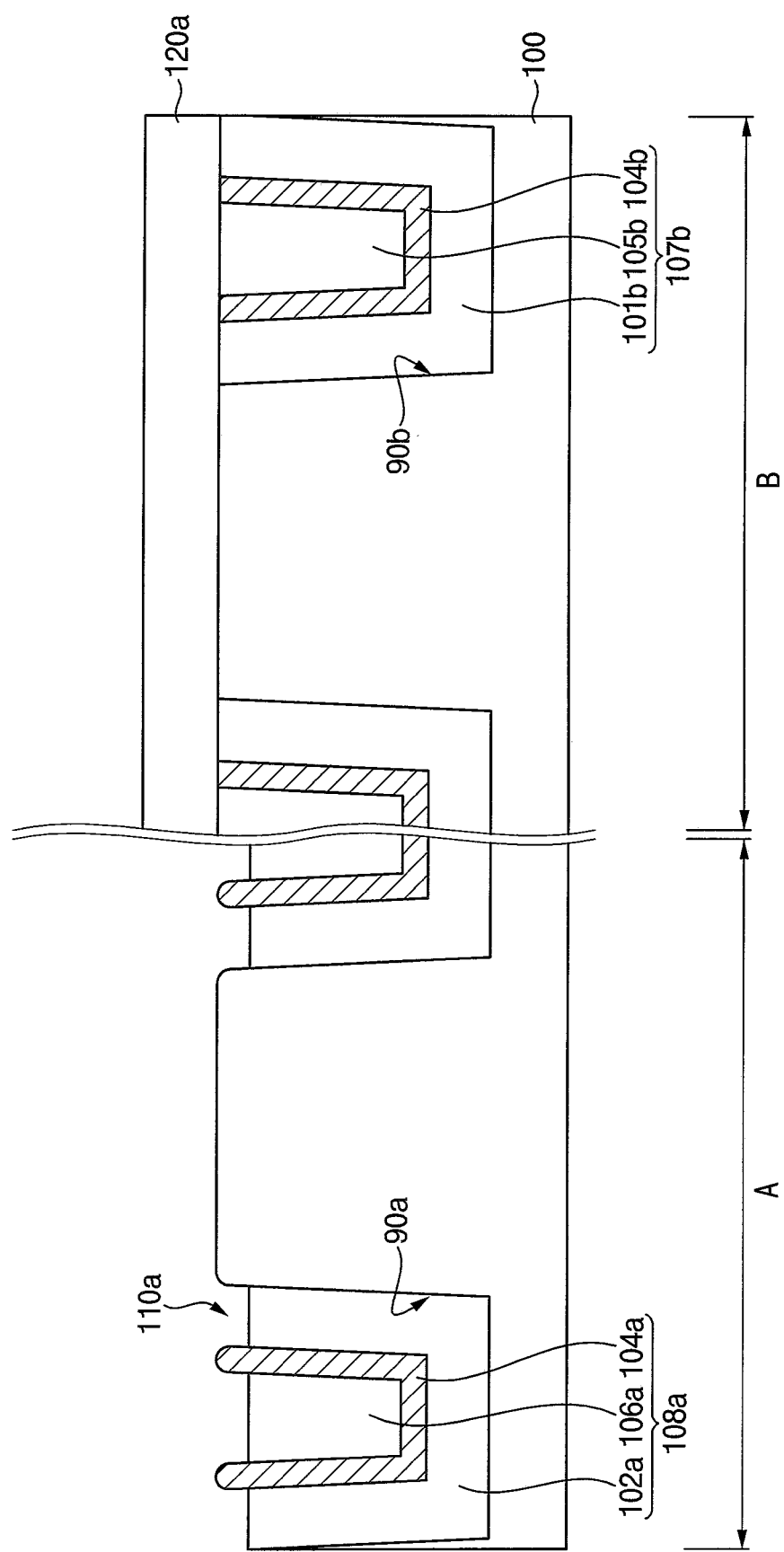

Referring to FIG. 6, the first mask layer may be etched using the first photoresist pattern 122 as an etching mask to form a first mask pattern 120a. The etching process of the first mask layer may include a wet etching process. When the wet etching process is performed, etching damages applied to the surface of the substrate 100 may be decreased. Thereafter, the first photoresist pattern 122 may be removed.

As the first mask layer includes silicon oxide, a silicon oxide layer may be etched in the etching process for forming the first mask pattern 120a. In the etching process for forming the first mask pattern 120a, a layer positioned below an etched first mask pattern 120a may be overetched, and thus a silicon oxide layer of an upper portion of the preliminary first isolation structure 107a may be etched together.

Therefore, upper portions of the preliminary first inner wall oxide pattern 101a and the preliminary first filling insulation layer pattern 105a included in the preliminary first isolation structure 107a may be partially etched to form the first isolation structure 108a. The first isolation structure 108a may include the first inner wall oxide pattern 102a, the first liner 104a, and the first filling insulation pattern 106a.

In the first isolation structure 108a, an upper surface of the first inner wall oxide pattern 102a may be lower than an upper surface of the first liner 104a, so that the first recessed portion 110a may be formed between the first liner 104a and the substrate 100 adjacent thereto. The substrate 100 of the first region A and an upper surface of the first isolation structure 108a may be exposed by the first mask pattern 120a.

In example embodiments, an etching thickness in the vertical direction of the preliminary first inner wall oxide pattern 101a may be less than a depositing thickness (i.e., a depositing thickness in the vertical direction from a sidewall of the first trench 90a) of the inner wall oxide layer. In example embodiments, an inner width of the first recessed portion 110a may be greater than a height from a bottom of the first recessed portion 110a to an uppermost surface of the first liner 104a.

As the first liner 104a includes silicon nitride, the first liner 104a may be hardly removed in the etching process. Thus, the uppermost surface of the first liner 104a may be substantially coplanar with the upper surface of the substrate 100 adjacent to the first liner 104a.

In example embodiments, an upper portion, e.g., an uppermost surface, of the first liner 104a may have a rounded shape, after the etching process. Further, an edge of the active region of the substrate 100 may have a rounded shape, after the etching process.

The first liner 104a may protrude from, e.g., above, upper portions of the first inner wall oxide pattern 102a and the first filling insulation pattern 106a. That is, the uppermost surface of the first liner 104a may be higher than the uppermost surfaces of the first inner wall oxide pattern 102a and the first filling insulation pattern 106a.

In example embodiments, a bottom of the first recessed portion 110a may have a flat surface. As the inner width of the first recessed portion 110a is increased, a central portion of the bottom of the first recessed portion 110a may not have a rounded shape. The central portion of the bottom of the first recessed portion 110a may have a flat surface. In some example embodiments, as shown in FIG. 2, the bottom of the first recessed portion 110a may have a slope with respect to the upper flat surface of the substrate.

Figure 7:
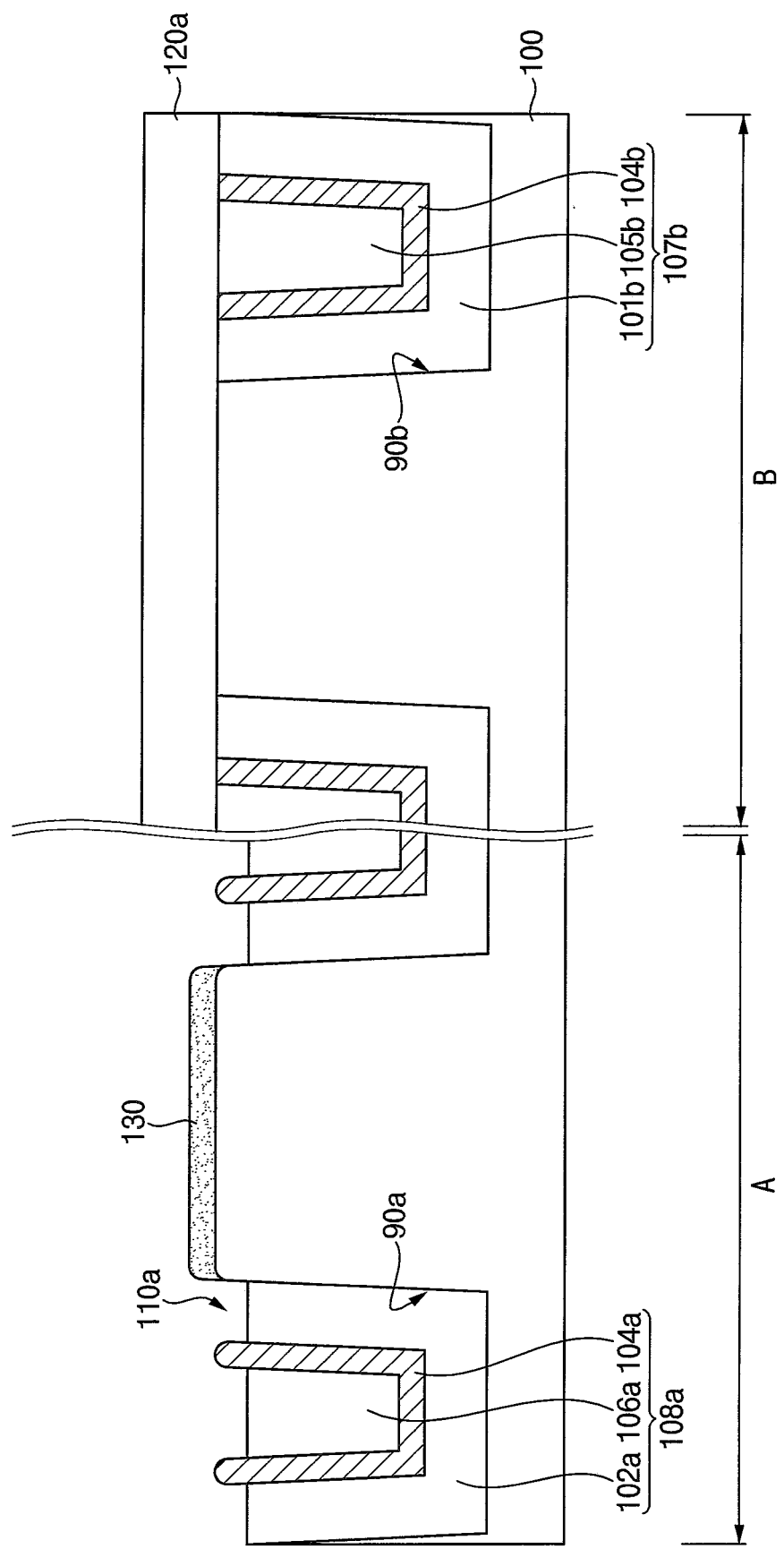

Referring to FIG. 7, the channel layer 130 may be formed on the upper surface of the substrate 100 of the first region exposed by the first mask pattern 120a. The channel layer 130 may be formed by, e.g., a selective epitaxial growth process (SEG). The channel layer 130 may include silicon germanium. The channel layer 130 may be selectively formed on the substrate 100 for forming a PMOS transistor.

Figure 8:
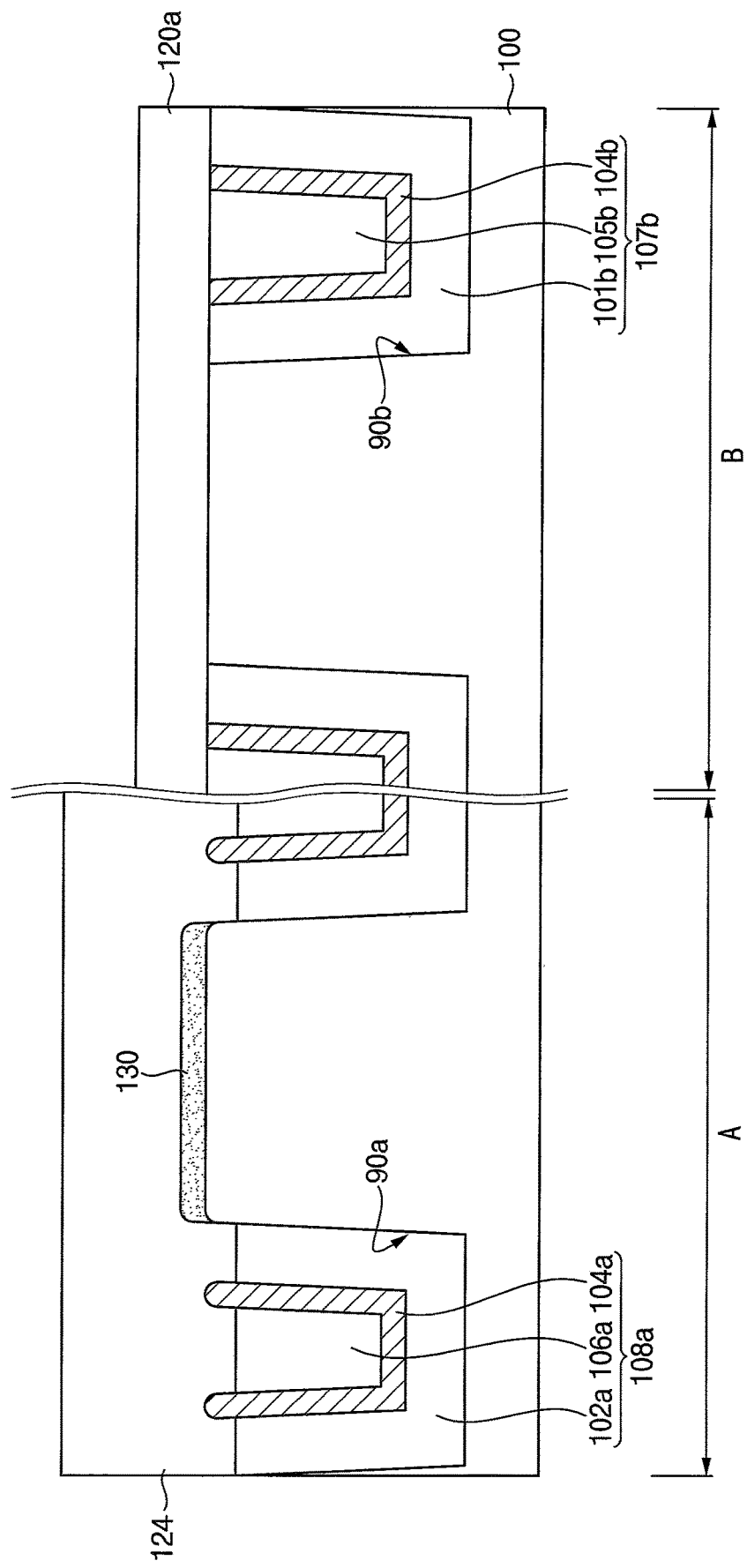

Referring to FIG. 8, a second photoresist pattern 124 may be formed on the channel layer 130 and the first isolation structure 108a in the first region A. The second photoresist pattern 124 may cover the first region A, and may expose the second region B.

The first mask pattern 120a in the second region B may be selectively exposed by the second photoresist pattern 124. The channel layer 130 and the first isolation structure 108a in the first region A may not be exposed by the second photoresist pattern 124.

Figure 9:
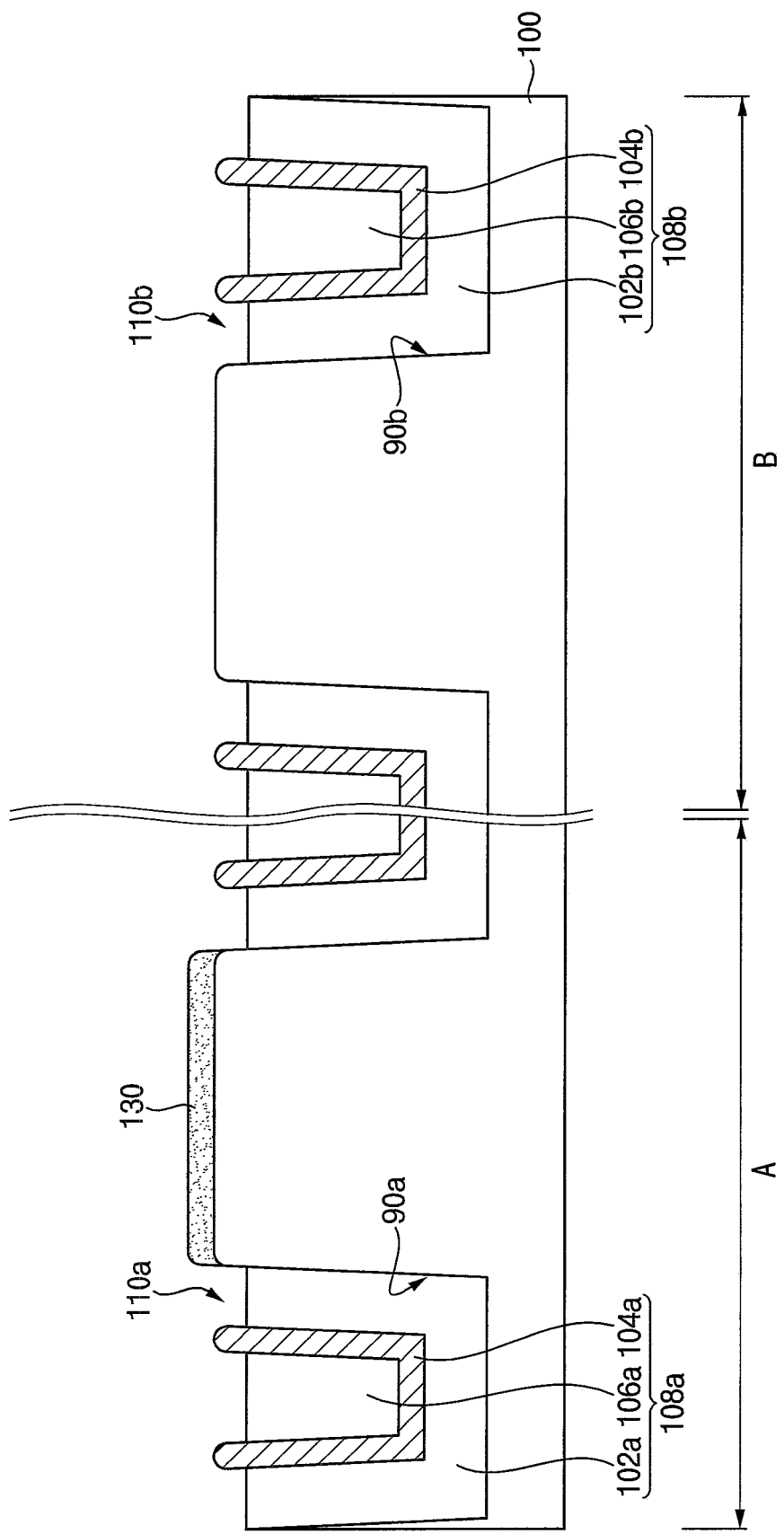

Referring to FIG. 9, the first mask pattern 120a may be removed using the second photoresist pattern 124 as an etching mask. The removing process of the first mask pattern 120a may include a wet etching process.

As the first mask pattern 120a includes silicon oxide, a silicon oxide layer may be etched in the removing process of the first mask pattern 120a. In the removing process of the first mask pattern 120a, a silicon oxide layer positioned below a removed first mask pattern 120a may be overetched, and thus a silicon oxide layer of an upper portion of the preliminary second isolation structure 107b may be etched together.

Therefore, upper portions of the preliminary second inner wall oxide pattern 101b and the preliminary second filling insulation layer pattern 105b included in the preliminary second isolation structure 107b may be partially etched to form the second isolation structure 108b. However, as the second liner 104b includes silicon nitride, the second liner 104b may be hardly removed during the removing process.

The second isolation structure 108b may include the second inner wall oxide pattern 102b, the second liner 104b, and the second filling insulation pattern 106b. The second liner 104b may protrude from, e.g., above, upper portions of the second inner wall oxide pattern 102b and the second filling insulation pattern 106b. That is, the uppermost surface of the second liner 104b may be higher than uppermost surfaces of the second inner wall oxide pattern 102b and the second filling insulation pattern 106b. The second recessed portion 110b may be formed between the second liner 104b and the substrate 100 adjacent thereto.

In example embodiments, in the removing process, a vertical level of a bottom of the second recessed portion 110b may be substantially the same as a vertical level of the bottom of the first recessed portion 110a. In example embodiments, a height of a protruding portion of the first liner 104a may be substantially the same as a height of a protruding portion of the second liner 104b.

In example embodiments, the second liner 104b may be hardly etched during the etching processes, so that the uppermost surface of the second liner 104b may be substantially coplanar with an upper surface of the substrate adjacent to the second liner 104b. Upper surfaces of the first and second liners 104a and 104b may be substantially coplanar with each other.

In example embodiments, an inner width of the second recessed portion 110b may be greater than a height from a bottom of the second recessed portion 110b to an uppermost surface of the second liner 104b. In example embodiments, the bottom of the second recessed portion 110b may be substantially flat. That is, the central portion of the bottom of the second recessed portion 110b may not have a rounded shape, and the bottom of the second recessed portion 110b may have a flat surface. In some embodiments, as shown in FIG. 2, the bottom of the second recessed portion 110b may have a slope with respect to the flat upper surface of the substrate 100.

As the second photoresist pattern 124 may be formed, a silicon oxide layer positioned at the first region A may not be removed during the removing process of the first mask pattern 120a. In the removing process of the first mask pattern 120a, layers included in the first isolation structure 108a may not be removed, so that a shape of the first isolation structure 108a may not change. Thereafter, the second photoresist pattern 124 may be removed.

Figure 10:
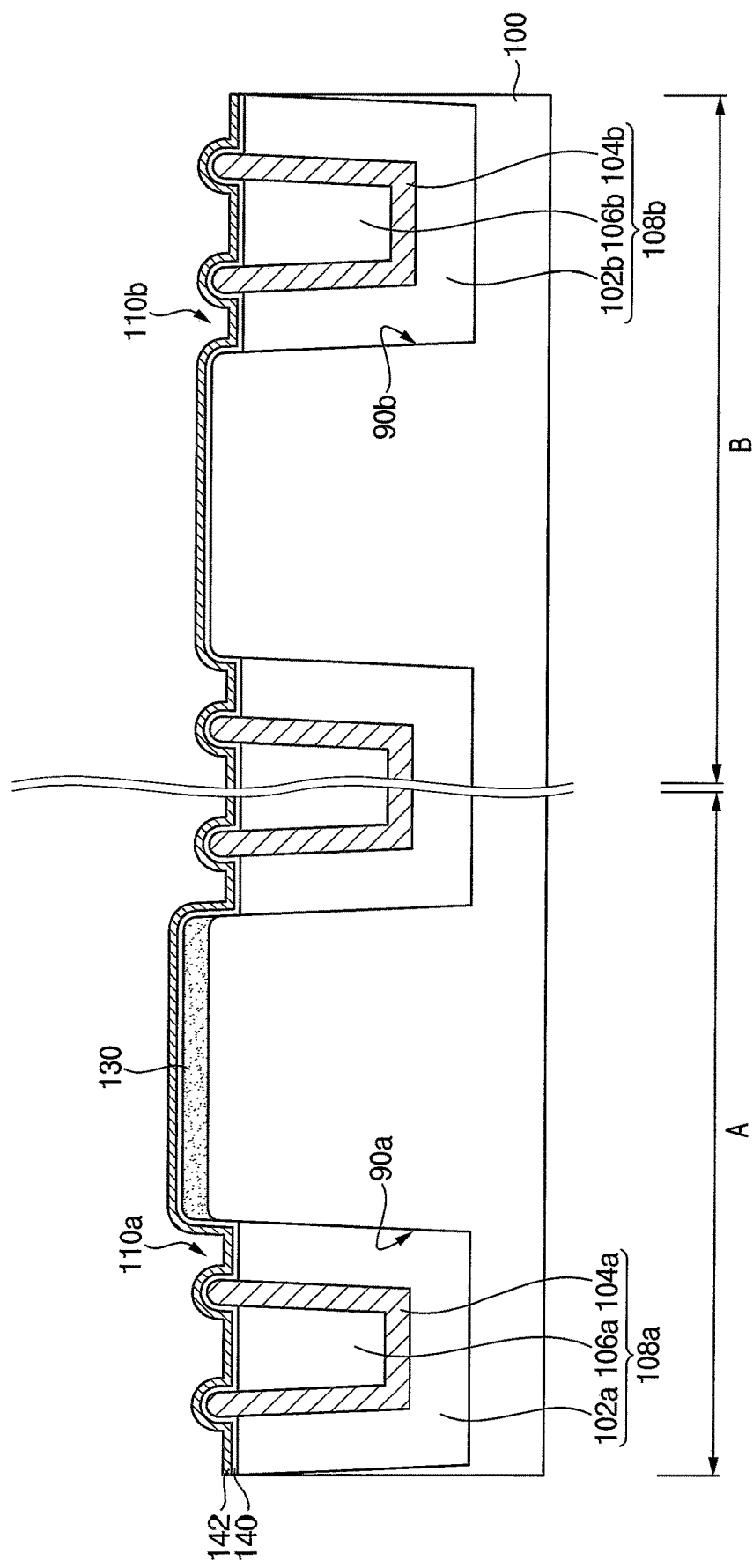

Referring to FIG. 10, a first interface insulation layer may be formed on the channel layer 130 of the first region A, and a second interface insulation layer may be formed on the substrate 100 of the second region B. The first and second interface insulation layers may be formed by a thermal oxidation process and/or a deposition process. The first and second interface insulation layers may be formed of, e.g., a silicon oxide layer and/or a silicon oxynitride layer.

A high-k dielectric layer 140 may be conformally formed on the first interface insulation layer, the second interface insulation layer, and the first and second isolation structures 108a and 108b. A P-type metal layer 142 may be conformally formed on the high-k dielectric layer 140. The P-type metal layer 142 may be formed not to completely fill the first and second recessed portions 110a and 110b, and the P-type metal layer 142 may be formed along sidewalls and bottoms of the first and second recessed portions 110a and 110b. Thus, after forming the P-type metal layer 142, each of the first and second recessed portions 110a and 110b may have remaining inner space.

The P-type metal layer 142 may include a metal layer having a P-work function. In example embodiments, the P-type metal layer 142 may include at least one of aluminum (Al), aluminum oxide, titanium nitride (TiN), tungsten nitride (WN), and ruthenium oxide ($RuO_2$). For example, the P-type metal layer 142 may include a stacked structure including a titanium nitride layer, an aluminum layer, and a titanium nitride layer or a stacked structure including a titanium nitride layer, an aluminum oxide layer, and a titanium nitride layer.

Figure 11:
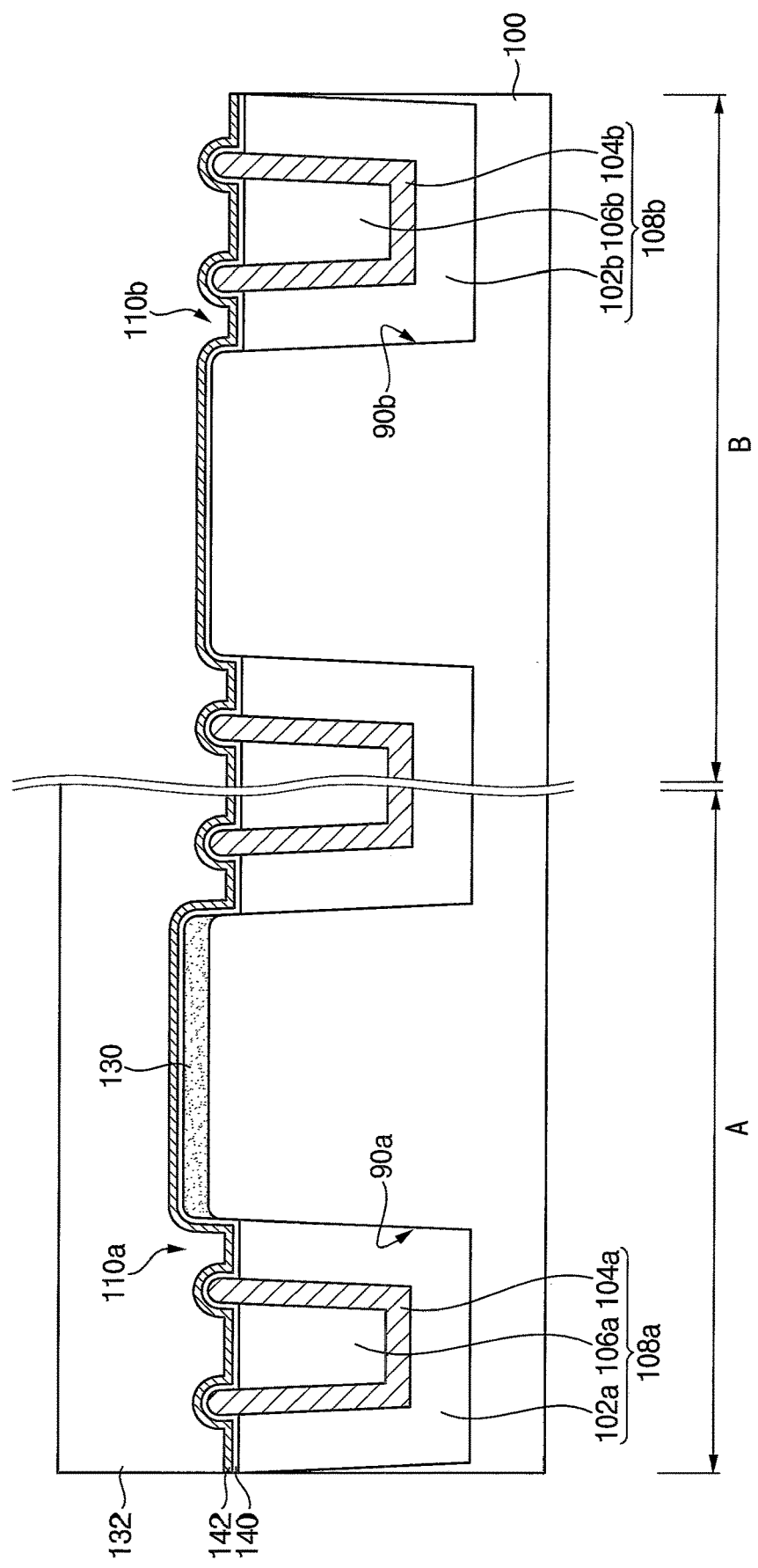

Referring to FIG. 11, a third mask pattern 132 may be formed on the P-type metal layer 142. The third mask pattern 132 may cover the first region A, and may expose the second region B. The third mask pattern 132 may include at least one of a photoresist, an amorphous carbon layer (ACL), a spin on hardmask (SOH), a spin on carbon (SOC), and a silicon nitride layer.

Figure 12:
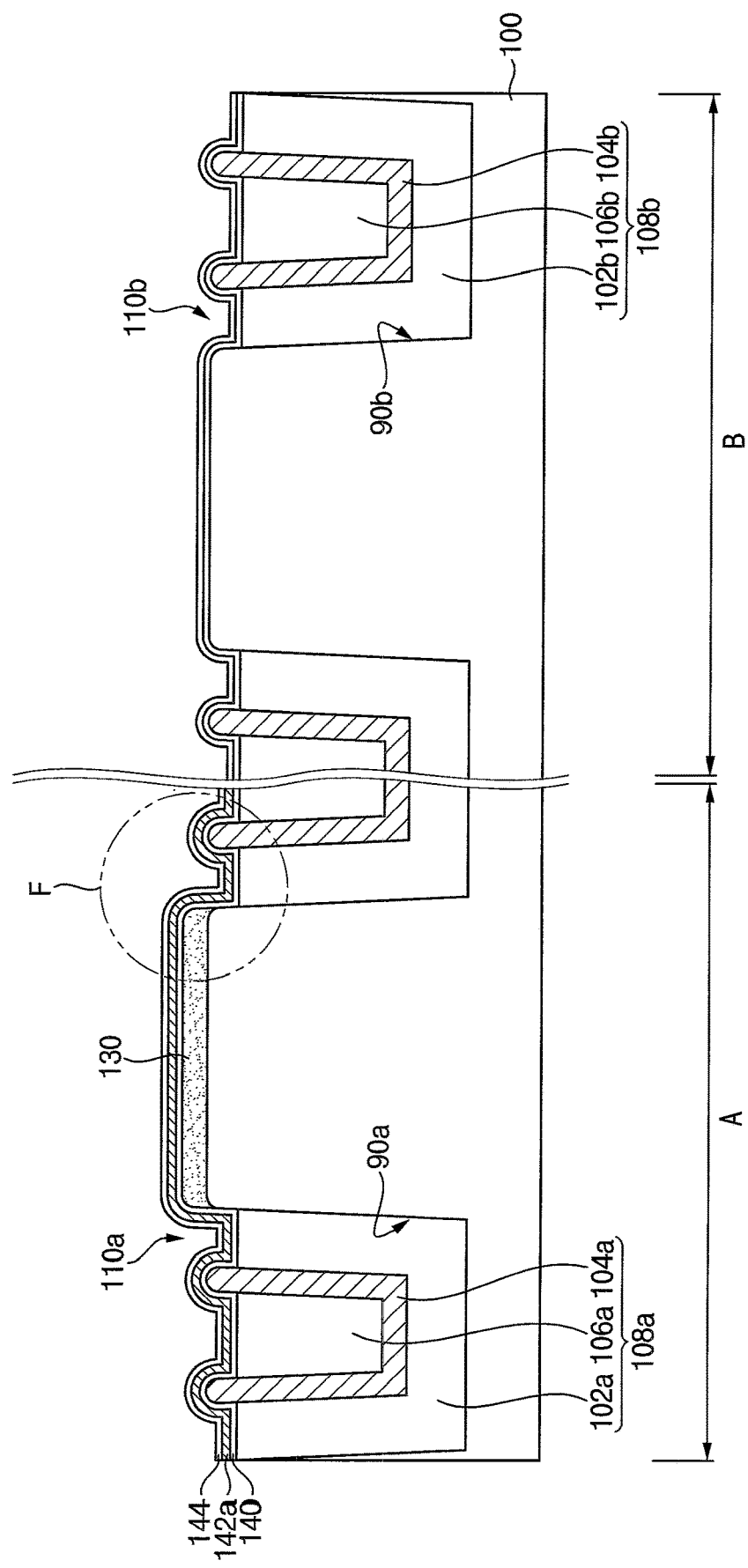

Referring to FIG. 12, the P-type metal layer 142 of the second region B may be etched using the third mask pattern 132 as an etching mask so as to expose the high-k dielectric layer 140. The P-type metal layer 142 may only remain in the first region A, and thus a preliminary P-type metal layer pattern 142a may be formed in the first region A. The process of etching the P-type metal layer 142 may include a wet etching process. As the wet etching process may be performed, etching damages of the high-k dielectric layer 140 may be decreased compared to performing a dry etching process.

The third mask pattern 132 may be removed. Thereafter, an N-type metal layer 144 may be conformally formed over entire surface of the substrate 100.

The N-type metal layer 144 may include a metal having an N-work function. In example embodiments, the N-type metal layer 144 may include at least one of lanthanum (La), lanthanum oxide (LaO), tantalum (Ta), tantalum nitride (TaN), niobium (Nb), and titanium nitride (TiN). For example, the N-type metal layer 144 may include a stacked structure including a lanthanum layer and a titanium nitride layer or a stacked structure including a lanthanum oxide layer and a titanium nitride layer.

Figure 13:
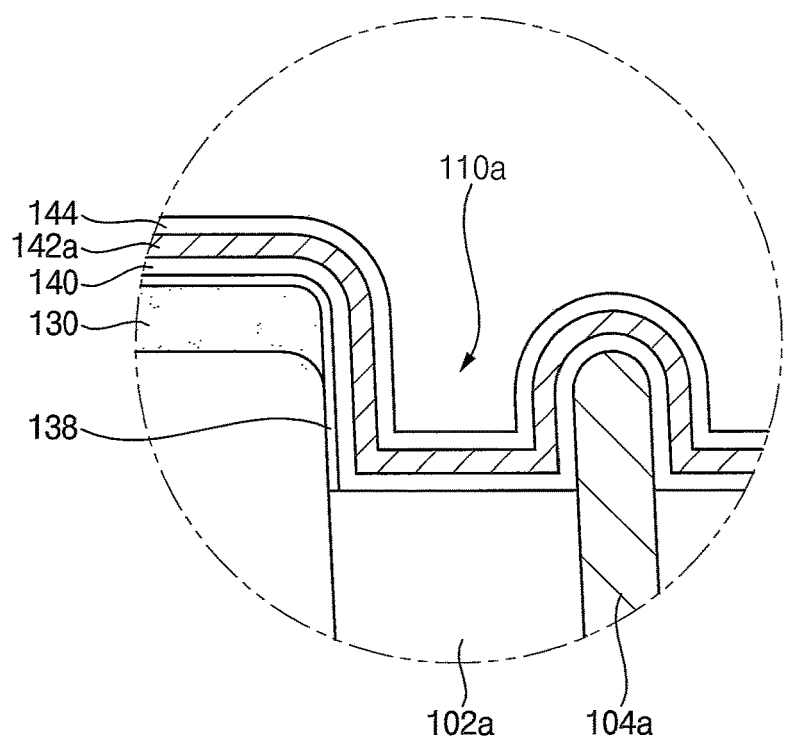
Figure 14:
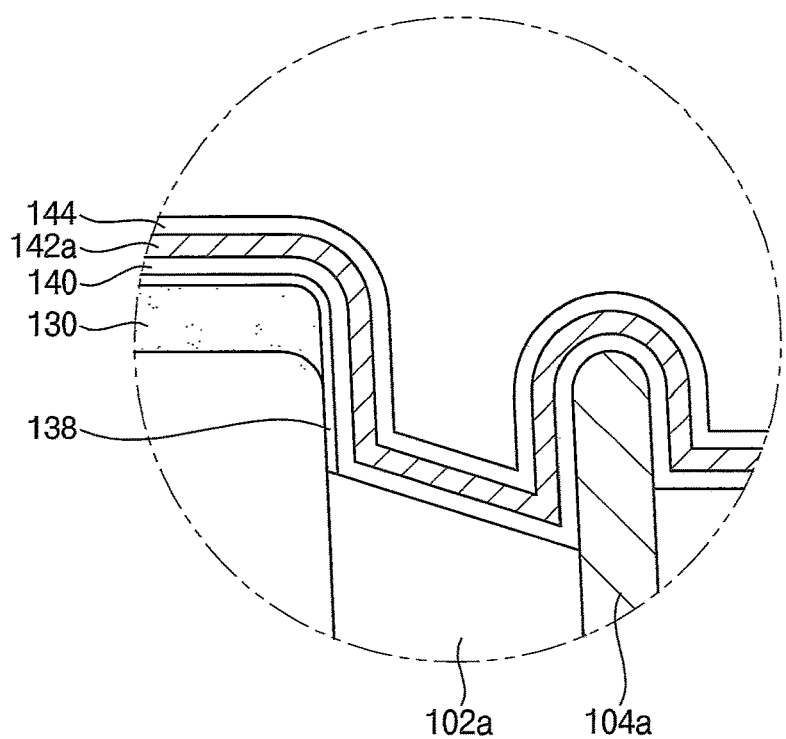

FIGS. 13 and 14 are enlarged views of portion "F" of FIG. 12.

Referring to FIG. 13, the bottom of the first recessed portion 110a may be substantially flat. In this case, after forming the preliminary P-type metal layer pattern 142a and the N-type metal layer 144, the first recessed portion 110a may have a remaining inner space.

Referring to FIG. 14, the bottom of the first recessed portion 110a may have a slope with respect to the flat upper surface of the substrate 100. In this case, after forming the preliminary P-type metal layer pattern 142a and the N-type metal layer 144, the first recessed portion 110a may have a remaining inner space.

Referring back to FIG. 12, after forming the N-type metal layer 144, the second recessed portion 110b may have remaining inner space. In example embodiments, a width of the inner space of each of the first and second recessed portions 110a and 110b may be greater than a sum of thicknesses of the layers formed on the upper sidewall of the first trench 90a exposed by the first recessed portion 110a. For example, referring to FIGS. 13 and 14, the width of the inner space of each of the first and second recessed portions 110a and 110b may be greater than a sum of thicknesses of the first interface insulation layer 138, the high-k dielectric layer 140, the preliminary P-type metal layer pattern 142a, and the N-type metal layer 144.

Figure 15:
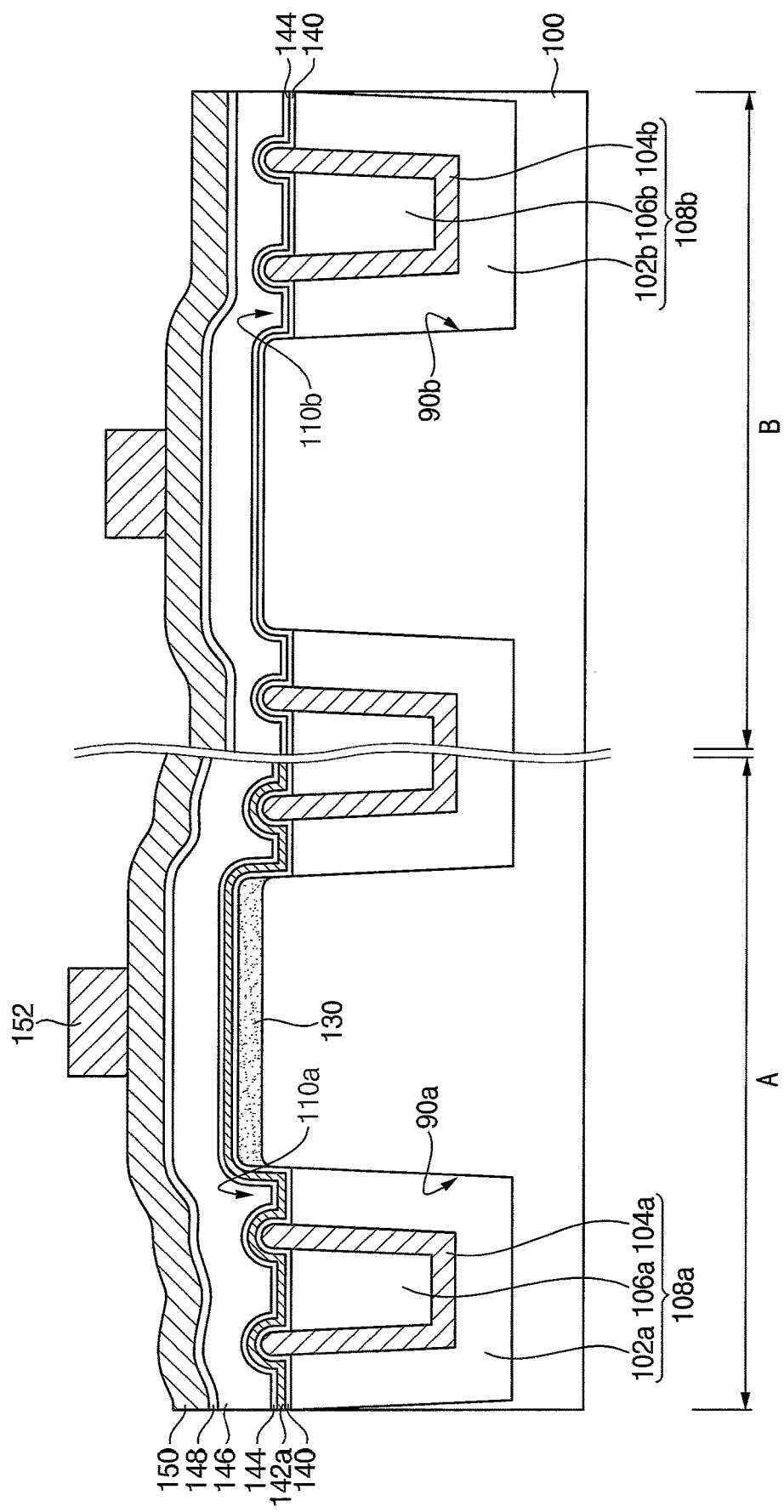

Referring to FIG. 15, a lower electrode layer 146, a barrier layer 148, an upper electrode layer 150, and a capping layer may be sequentially stacked on the N-type metal layer 144. The capping layer may be patterned to form the capping layer pattern 152.

The lower electrode layer 146 may be formed of a polysilicon layer doped with impurities. Particularly, for forming the lower electrode layer 146, the polysilicon layer may be deposited on the N-type metal layer 144. Thereafter, the polysilicon layer positioned on the first region A may be doped with P-type impurities, and the polysilicon layer positioned on the second region B may be doped with N-type impurities. In example embodiments, the lower electrode layer 146 may be formed to fill the first and second recessed portions 110a and 110b.

The barrier layer 148 may be formed of, e.g., a titanium nitride layer, a tungsten nitride layer, or a tantalum nitride layer. The upper electrode layer 150 may include a metal material, e.g., tungsten. The capping layer pattern 152 may include, e.g., silicon nitride.

Figure 16:
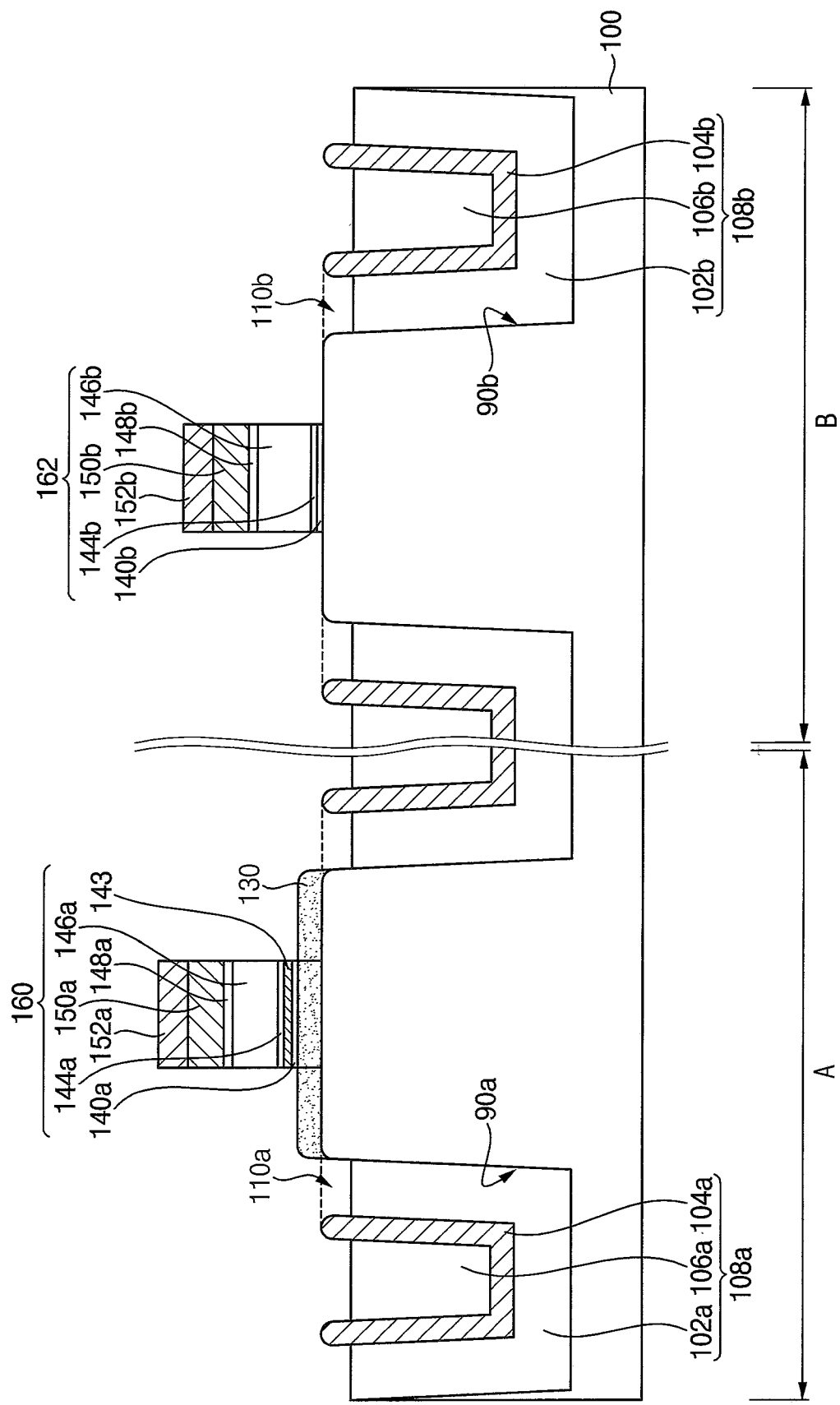

Referring to FIG. 16, the upper electrode layer 150, the barrier layer 148, the lower electrode layer 146, the N-type metal layer 144, a preliminary P-type metal layer pattern 142a, the high-k dielectric layer 140, and the first and second interface insulation layers may be sequentially etched using the capping layer pattern 152 as an etching mask to form the first gate structure 160 in the first region A and the second gate structure 162 in the second region B. The etching process may include an anisotropic etching process.

The first gate structure 160 may include a first interface insulation pattern, the first high-k dielectric pattern 140a, the first P-type metal pattern 143, the first N-type metal pattern 144a, the first lower electrode 146a, the first barrier pattern 148a, the first upper electrode 150a, and the first capping layer pattern 152a stacked. The second gate structure 162 may include a second interface insulation pattern, the second high-k dielectric pattern 140b, the second N-type metal pattern 144b, the second lower electrode 146b, the second barrier pattern 148b, the second upper electrode 150b, and the second capping layer pattern 152b stacked.

In the etching process, it is required that both the preliminary P-type metal layer pattern 142a and the N-type metal layer 144 formed in the first and second recessed portions 110a and 110b are completely removed. If the inner widths of the first and second recessed portions 110a and 110b were to be narrow, etching gases would not have easily flown into the first and second recessed portions 110a and 110b, thereby causing the preliminary P-type metal layer pattern 142a and the N-type metal layer 144 to partially remain in the first and second recessed portions 110a and 110b, which in turn, would have generated defects by residues of the preliminary P-type metal layer pattern 142a and the N-type metal layer 144.

In contrast, according to example embodiments, after forming the preliminary P-type metal layer pattern 142a and the N-type metal layer 144, each of the first and second recessed portions 110a and 110b may maintain sufficient inner space, e.g., due to their larger width. Therefore, the etching gases for etching the metal materials may easily and sufficiently flow into the first and second recessed portions 110a and 110b, so that both the preliminary P-type metal layer pattern 142a and the N-type metal layer 144 positioned in the first and second recessed portions 110a and 110b may be completely removed.

Further, if the inner widths of the first and second recessed portions 110a and 110b were to be narrow, the bottom of the first and second recessed portions 110a and 110b would have had a rounded shape. In this case, the metal layer would have been formed to have a relatively thick thickness in lower portions having the round portions of the first and second recessed portions 110a and 110b, so that the metal layer would have filled the lower portions of the first and second recessed portions 110a and 110b. A thickness in the vertical direction of the metal layer formed on the bottoms of the first and second recessed portion would have increased, thereby making removal of the metal layer from the bottoms of the first and second recessed portions 110a and 110b difficult.

In contrast, according to example embodiments, as the bottoms of the first and second recessed portions 110a and 110b have flat surfaces, the N-type metal layer 144 and the preliminary P-type metal layer pattern 142a may not be folded at the bottoms of the first and second recessed portions 110a and 110b. The N-type metal layer 144 and the preliminary P-type metal layer pattern 142a formed on the bottom of the first and second recessed portions 110a and 110b may have flat surfaces. Thus, metal layers formed on the bottom of the first and second recessed portions 110a and 110b may be easily removed.

Referring to FIG. 1 again, the first spacer 164 may be formed on a sidewall of the first gate structure 160, and the second spacer 166 may be formed on a sidewall of the second gate structure 162. P-type impurities may be implanted onto the substrate 100 adjacent to both sides of the first gate structure 160 to form the first impurity regions 170. N-type impurities may be implanted onto the substrate 100 adjacent to both sides of the second gate structure 162 to form the second impurity regions 172.

As described above, a semiconductor device having high reliability may be manufactured.

Figure 17:
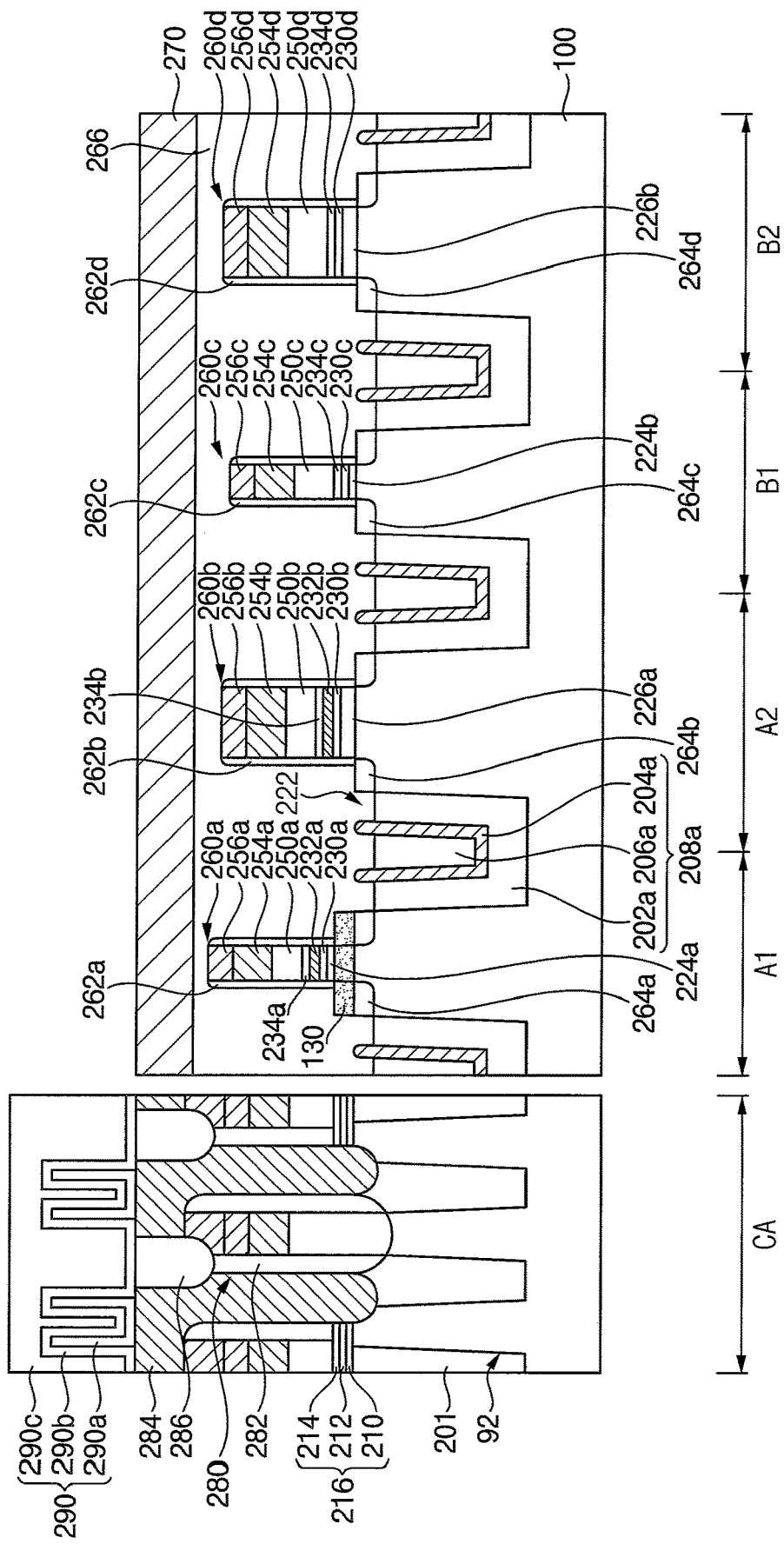
FIG. 17 is a cross-sectional view of a semiconductor device in accordance with example embodiments.

FIG. 17 is a cross-sectional view of a semiconductor device in accordance with example embodiments.

Referring to FIG. 17, the substrate 100 may include a cell array region CA, a first peripheral region A1, a second peripheral region A2, a third peripheral region B1, and a fourth peripheral region B2. The first to fourth peripheral regions A1, A2, B1, and B2 may be disposed around the cell array region CA. Peripheral circuits for driving cells formed in the cell array region CA may be formed in the first to fourth peripheral regions A1, A2, B1, and B2.

A low voltage PMOS transistor may be formed in the first peripheral region A1. A high voltage PMOS transistor may be formed in the second peripheral region A2. A low voltage NMOS transistor may be formed in the third peripheral region B1. A high voltage NMOS transistor may be formed in the fourth peripheral region B2.

Memory cells may be formed in the cell array region CA. For example, the memory cells may include dynamic random-access memory (DRAM) cells.

A cell isolation structure 201 may be formed in a cell trench 92 at the substrate 100 of the cell array region CA. A portion of the substrate 100 of the cell array region CA, in which the cell isolation structure 201 is not formed, may be defined as cell active regions. Each of the cell active regions may have an isolated shape. In a plan view, each of the cell active regions may have an isolated bar shape. Each of the cell active regions may be arranged in a direction oblique to an extending direction of a word line. The substrate 100 may be a single crystal silicon substrate or an SOI substrate.

In the cell array region CA, a width of the cell trench 92 may vary according to a space between adjacent cell active regions, and a stacked structure of the cell isolation structure 201 filling the cell trench may also vary according to the width of the cell trench 92. In example embodiments, when the width of the cell trench 92 is narrow, the cell trench 92 may be completely filled with an inner wall oxide layer including silicon oxide. In this case, the cell isolation structure 201 may include only silicon oxide, in a cross sectional view.

In some example embodiments, the cell trench may be completely filled with an inner wall oxide layer and a nitride liner, according to the width of the cell trench. In this case, the cell isolation structure may include silicon oxide and silicon nitride, in a cross sectional view.

A buried word line may be formed in the cell active region and the cell isolation structure 201. The buried word line may extend in a first direction. Impurity regions may be formed at the substrate 100 adjacent to both sides of the word line in the cell active region.

A buffer layer 216 may be formed on the substrate 100 in the cell array region CA. In example embodiments, the buffer layer 216 may include a first insulation layer pattern 210, a second insulation layer pattern 212, and a third insulation layer pattern 214 sequentially stacked. The second insulation layer pattern 212 may include a material having a high etch selectivity with respect to the first and third insulation layer patterns 210 and 214. For example, the second insulation layer pattern 212 may be formed of a silicon nitride layer, and each of the first and third insulation layer patterns 210 and 214 may be formed of a silicon oxide layer. In some example embodiments, the buffer layer 216 may have a two-layer structure including a silicon oxide layer and a silicon nitride layer.

A bit line structure 280 may be formed on the buffer layer 216. The bit line structure 280 may extend in a second direction perpendicular to the first direction. The bit line structure 280 may include a lower electrode, an upper electrode, a barrier pattern, and a capping layer pattern sequentially stacked. In addition, a portion of the bit line structure 280 may contact the impurity region of the substrate 100.

The bit line structure 280 may be formed by the same deposition processes as the deposition processes for forming the first to fourth gate structures 260a, 260b, 260c, and 260d in the first to fourth peripheral regions A1, A2, B1, and B2, as will be described in detail below. Thus, the bit line structure 280 may include materials included in the first to fourth gate structures 260a, 260b, 260c, and 260d.

The lower electrode may include polysilicon doped with impurities. The upper electrode may include a metal, e.g., tungsten. The capping layer pattern may include silicon nitride.

A bit line spacer 282 may be formed on a sidewall of the bit line structure 280. An insulation layer may be formed to fill a space between adjacent bit line structures 280. The insulation layer may, e.g., silicon oxide.

Contact plugs 284 may pass through the insulation layer, and the contact plugs 284 may be formed between adjacent bit line structures 280. The contact plugs 284 may contact the surface of the substrate 100. In example embodiments, the contact plugs 284 may include a polysilicon pattern and a metal pattern stacked.

An upper insulation pattern 286 may be formed between the upper portions of the contact plugs 284. Upper portions of the contact plugs 284 may be electrically isolated by the upper insulation pattern 286.

A capacitor 290 may be formed on each of the contact plugs 284. The capacitor 290 may include a lower electrode 290a, a dielectric layer 290b, and an upper electrode 290c stacked. In the capacitor 290, the lower electrode 290a may have a cylindrical shape or a pillar shape.

In the first to fourth peripheral regions A1, A2, B1, and B2, isolation structures 208a may be formed in trenches in the substrate 100, respectively. In the first to fourth peripheral regions A1, A2, B1, and B2, a region of the substrate 100 between the isolation structures 208a may be defined as a peripheral active region.

The channel layer 130 may be formed on the substrate 100 of the first peripheral region A1. The channel layer 130 may be formed of, e.g., silicon germanium. A first gate structure 260a may be formed on the channel layer 130. First impurity regions 264a may be formed at the channel layer 130 adjacent to both sides of the first gate structure 260a. The first impurity regions 264a may be doped with P-type impurities.

A second gate structure 260b may be formed on the substrate 100 of the second peripheral region A2. Second impurity regions 264b may be formed at the substrate 100 adjacent to both sides of the second gate structure 260b. The second impurity regions 264b may be doped with P-type impurities.

A third gate structure 260c may be formed on the third peripheral region B1. Third impurity regions 264c may be formed at the substrate 100 adjacent to both sides of the third gate structure 260c. The third impurity region 264c may be doped with N-type impurities.

A fourth gate structure 260d may be formed on the fourth peripheral region B2. Fourth impurity regions 264d may be formed at the substrate 100 adjacent to both sides of the fourth gate structure 260d. The fourth impurity regions 264d may be doped with N-type impurities.

In example embodiments, each of the isolation structures 208a formed in the first to fourth peripheral regions A1, A2, B1, and B2 may be substantially the same as the first and second isolation structures 108a and 1098b described with reference to FIG. 1. Each of the isolation structures 208a formed in the first to fourth peripheral regions A1, A2, B1, and B2 may include an inner wall oxide pattern 202a, a nitride liner 204a, and a filling insulation pattern 206a.

In the isolation structure 208a, the nitride liner 204a may protrude from upper portions of the inner wall oxide pattern 202a and the filling insulation pattern 206a. That is, an uppermost surface of the nitride liner 204a may be higher than uppermost surfaces of the inner wall oxide pattern 202a and the filling insulation pattern 206a. A recessed portion 222 may be formed between the nitride liner 204a and the substrate 100 adjacent to the nitride liner 204a.

In example embodiments, an inner width of the recessed portion 222 may be greater than a height from a bottom of the recessed portion 222 to an uppermost surface of the nitride liner 204a. In example embodiments, the bottom of the recessed portion 222 may have a flat surface. That is, the central portion of the bottom of the recessed portion 222 may not have a rounded shape, and may have a flat surface.

In example embodiments, in the isolation structures 208a in the first to fourth peripheral regions A1, A2, B1 and B2, heights (i.e., vertical levels) of the uppermost surfaces of the nitride liners 204a may be substantially the same. In example embodiments, in each of the isolation structures 208a of the first to fourth peripheral regions A1, A2, B1, and B2, the uppermost surface of each of the nitride liners 204a may be substantially coplanar with an upper surface of the substrate 100 adjacent to the nitride liner 204a.

The first gate structure 260a may include a first interface insulation pattern 224a, a first high-k dielectric pattern 230a, a first P-type metal pattern 232a, a first N-type metal pattern 234a, a first lower electrode 250a, a first barrier pattern, a first upper electrode 254a, and a first capping layer pattern 256a sequentially stacked. The second gate structure 260b may include a second interface insulation pattern 226a, a second high-k dielectric pattern 230b, a second P-type metal pattern 232b, a second N-type metal pattern 234b, a second lower electrode 250b, a second barrier pattern, a second upper electrode 254b, and a second capping layer pattern 256b sequentially stacked.

A gate length of the first gate structure 260a may be less than a gate length of the second gate structure 260b. The gate length of the first and second gate structures 260a and 160b may be a line width of the gate structure.

A thickness of the first interface insulation pattern 224a may be less than a thickness of the second interface insulation pattern 226a. In example embodiments, a material of the first interface insulation pattern 224a may be different from a material of the second interface insulation pattern 226a. For example, the first interface insulation pattern 224a may include silicon oxide, and the second interface insulation pattern 226a may include silicon oxynitride.

The first and second gate structures 260a and 260b may have substantially the same stacked structure, except for the first and second interface insulation patterns 224a and 226a. That is, in the first and second gate structures 260a and 260b, a stacked structure formed on the first interface insulation pattern 224a and a stacked structure formed on the second interface insulation pattern 226a may be substantially the same. In the first and second gate structures 260a and 260b, the stacked structures formed on the first and second interface insulation patterns 224a and 226a may be substantially the same as the stacked structure formed on the first interface insulation pattern in the first gate structure described with reference to FIG. 1.

The third gate structure 260c may include a third interface insulation pattern 224b, a third high-k dielectric pattern 230c, a third N-type metal pattern 234c, a third lower electrode 250c, a third barrier pattern, a third upper electrode 254c, and a third capping layer pattern 256c sequentially stacked. The fourth gate structure 260d may include a fourth interface insulation pattern 226b, a fourth high-k dielectric pattern 230d, a fourth N-type metal pattern 234d, a fourth lower electrode 250d, a fourth barrier pattern, a fourth upper electrode 254d, and a fourth capping layer pattern 256d sequentially stacked.

A gate length of the third gate structure 260c may be less than a gate length of the fourth gate structure 260d. A thickness of the third interface insulation pattern 224b may be less than a thickness of the fourth interface insulation pattern 226b. In example embodiments, a material of the third interface insulation pattern 224b may be different from a material of the fourth interface insulation pattern 226b. For example, the third interface insulation pattern 224b may include silicon oxide, and the fourth interface insulation pattern 226b may include silicon oxynitride.

The third and fourth gate structures 260c and 260d may have the same stacked structure, except for the third and fourth interface insulation patterns 224b and 226b. That is, in the third and fourth gate structures 260c and 260d, a stacked structure formed on the third interface insulation pattern 224b and a stacked structure formed on the fourth interface insulation pattern 226b may be substantially the same. In the third and fourth gate structures 260c and 260d, the stacked structures formed on the third and fourth interface insulation patterns 224b and 226b may be substantially the same as the stacked structure formed on the second interface insulation pattern in the second gate structure described with reference to FIG. 1.

As described above, the bit line structure 280 in the cell array region CA may include a first structure in which the lower electrode, the barrier pattern, the upper electrode, and the capping layer pattern are stacked. In addition, in the first and second gate structures 260a and 260b, the first structure including the lower electrode, the barrier pattern, the upper electrode, and the capping layer pattern may be stacked on each of the first and second N-type metal patterns 234a and 234b. In the third and fourth gate structures 260c and 260c, the first structure including the lower electrode, the barrier pattern, the upper electrode, and the capping layer pattern may be stacked on each of the third and fourth N-type metal patterns 234c and 234d.

First to fourth spacers 262a, 262b, 262c and 262d may be formed on sidewalls of the first to fourth gate structures 260a, 260b, 260c and 260d, respectively. An insulating interlayer 266 may be formed to cover the first to fourth gate structures 260a, 260b, 260c and 260d.

An upper capping layer 270 may be formed on the insulating interlayer 266 in the first to fourth peripheral regions A1, A2, B1, and B2.

As described above, the DRAM cells may be formed in the cell array region CA. The low voltage PMOS transistor, the high voltage PMOS transistor, the low voltage NMOS transistor, and the high voltage NMOS transistors including high-k dielectric layers may be formed in the first to fourth peripheral regions A1, A2, B1, and B2. At least the low voltage PMOS transistor may be formed on the channel layer 130 including the silicon germanium. The isolation structure including the nitride liner 204a having the protruding portion may be formed in the first to fourth peripheral regions A1, A2, B1, and B2. The uppermost surface of the nitride liner 204a may be coplanar with the upper surface of the substrate 100 adjacent thereto.

Figure 18:
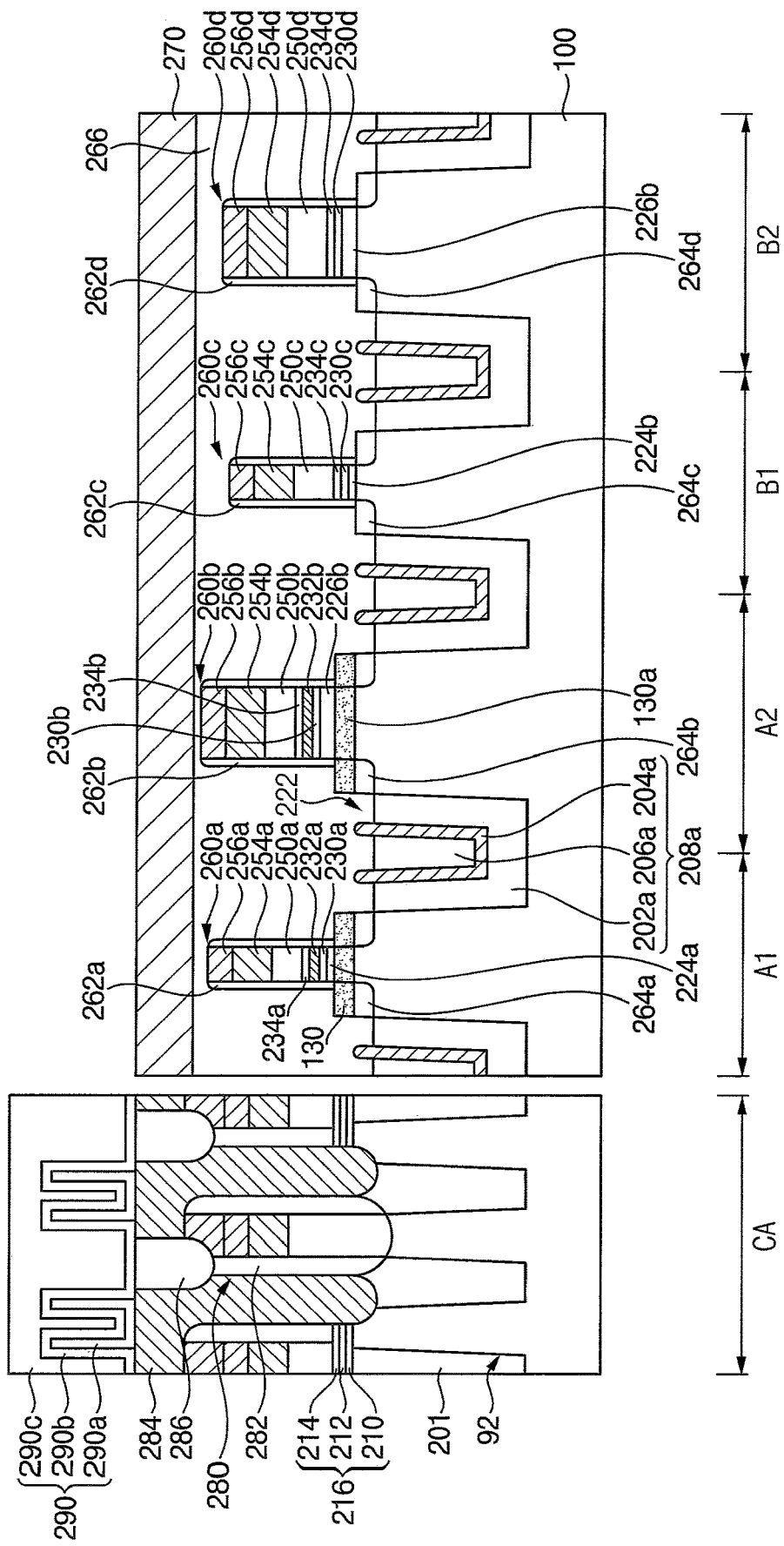
FIG. 18 is a cross-sectional view of a semiconductor device in accordance with example embodiments.

FIG. 18 is a cross-sectional view of a semiconductor device in accordance with example embodiments. The semiconductor device in FIG. 18 may be substantially the same as the semiconductor device shown in FIG. 17, except for further including a second channel layer.

Referring to FIG. 18, a second channel layer 130a may be further formed on the substrate 100 of the second peripheral region A2. The second channel layer 130a may be formed of, e.g., silicon germanium. The second gate structure 260b may be formed on the second channel layer 130a. That is, the high voltage PMOS transistor may be formed on the second channel layer 130a.

FIGS. 19 to 26 are cross-sectional views of stages in a method of manufacturing a semiconductor device in accordance with example embodiments.

Figure 19:
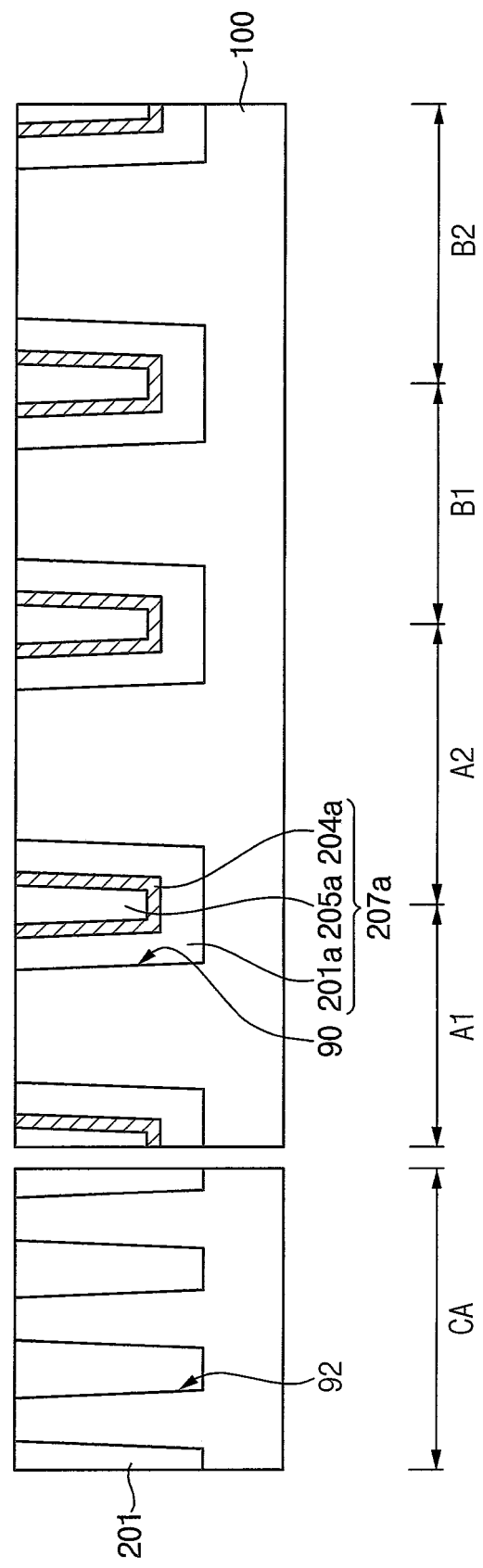
FIGS. 19 to 26 are cross-sectional views of stages in a method of manufacturing a semiconductor device in accordance with example embodiments.

Referring to FIG. 19, the substrate 100 may include the cell array region CA, the first peripheral region A1, the second peripheral region A2, the third peripheral region B1, and the fourth peripheral region B2. A portion of the substrate 100 may be etched to form the cell trench 92 and the peripheral trench 90. The cell trench 92 may have a width less than a width of the peripheral trench 90.

A preliminary isolation structure 207a including a preliminary inner wall oxide pattern 201a, a nitride liner 204a, and a preliminary filling insulation pattern 205a may be formed in the peripheral trench 90. In example embodiments, the cell trench 92 may be filled with the inner wall oxide pattern, and thus a cell isolation structure 201 including the inner wall oxide pattern may be formed. In some example embodiments, a portion of the cell trench 92 may be filled with the inner wall oxide pattern and the nitride liner.

Word lines buried in the substrate 100 may be formed in the cell array region CA. An ion implantation process may be performed to form impurity regions in the substrate 100 adjacent to both sides of the word line in the cell array region CA.

Figure 20:
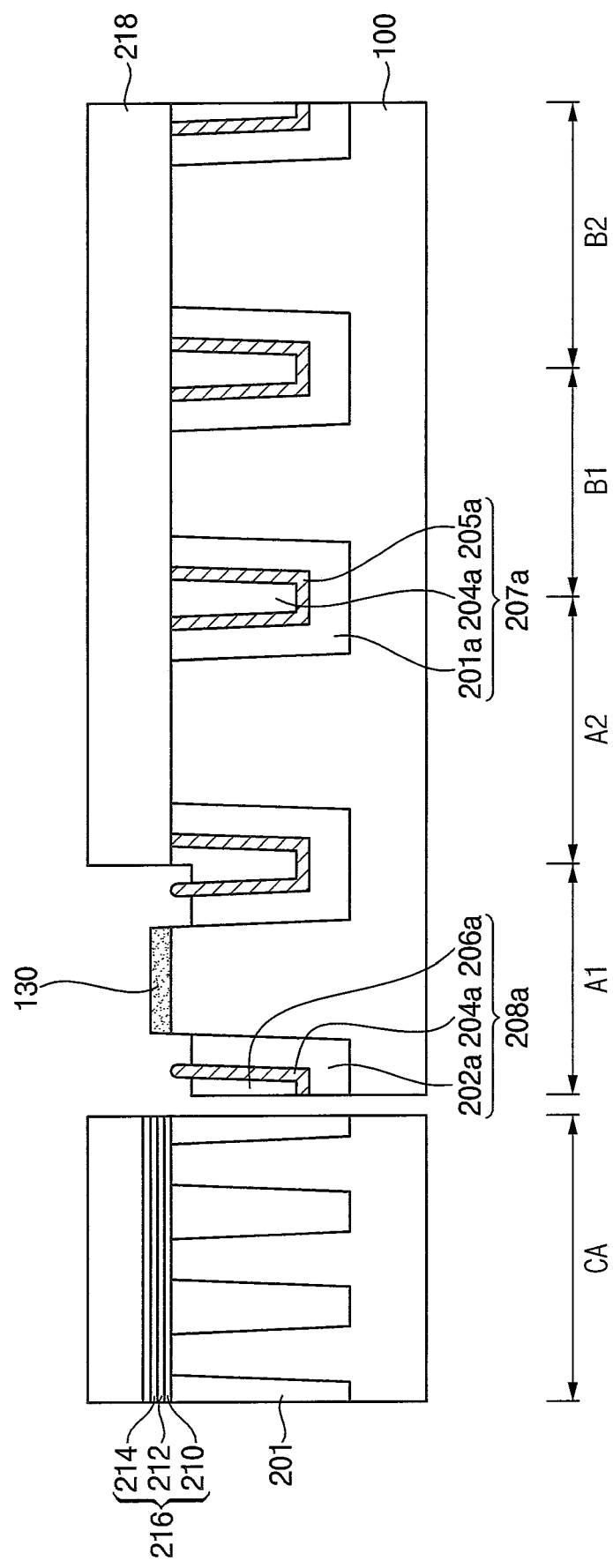

Referring to FIG. 20, a first insulation layer, a second insulation layer, and a third insulation layer may be sequentially stacked on an entire surface of the substrate 100 and the cell isolation structure 201. The first insulation layer, the second insulation layer, and the third insulation layer may be patterned to form a buffer layer 216 including a first insulation layer pattern 210, a second insulation layer pattern 212 and a third insulation layer pattern 214 in the cell array region CA.

A first mask pattern 218 may be formed on the substrate 100. The first mask pattern 218 may cover the cell array region CA and the second to fourth peripheral regions A2, B1, and B2, and may expose the first peripheral region A1. The first mask pattern 218 may be formed of, e.g., a silicon oxide layer.

When the first mask pattern 218 is formed by an etching process, upper portions of a preliminary inner wall oxide pattern 201a and a preliminary filling insulation pattern in the preliminary isolation structure 207a in the first peripheral region A1 may be only etched by over etching in the etching process. Thus, etched thicknesses of the preliminary inner wall oxide pattern 201*a* and the preliminary filling insulation pattern 205*a* may be decreased.

Therefore, the isolation structure 208*a* including an inner wall oxide pattern 202*a*, the nitride liner 204*a*, and a filling insulation pattern 206*a* may be formed in the first peripheral region A1. The nitride liner 204*a* may protrude from upper surfaces of the inner wall oxide pattern 202*a* and the filling insulation pattern 206*a*.

The channel layer 130 may be formed on the substrate 100 of the first peripheral region A1 exposed by the first mask pattern 218. The channel layer 130 may be formed of, e.g., a silicon germanium layer. The channel layer 130 may be formed by a selective epitaxial growth (SEG) process.

In some example embodiments, the first mask pattern may expose the first and second peripheral regions A1 and A2. In this case, the channel layer may be formed on the substrate 100 of the first peripheral region A1 and the second peripheral region A2. Therefore, the semiconductor device shown in FIG. 18 may be manufactured by subsequent processes.

Figure 21:
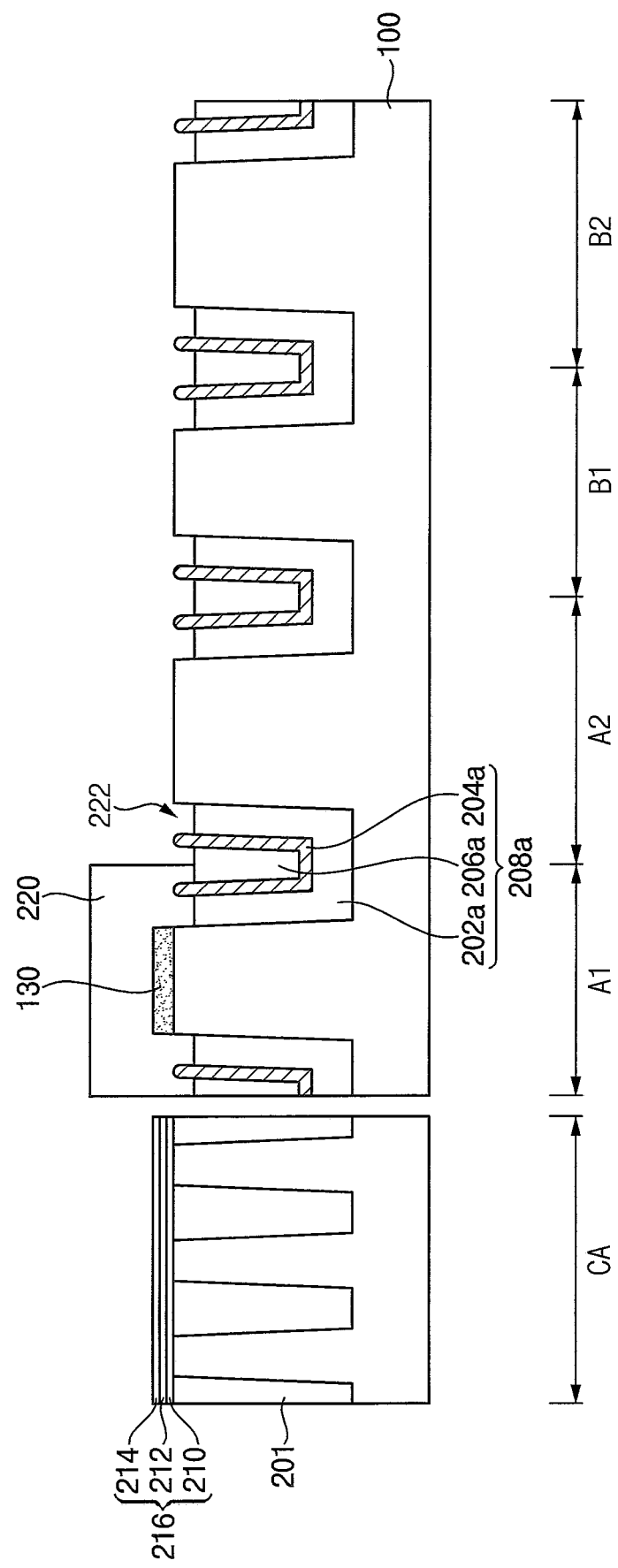

Referring to FIG. 21, a photoresist pattern 220 may be formed to cover the channel layer 130 and the isolation structure 208*a* in the first peripheral region A1. Thereafter, the first mask pattern 218 may be removed.

When the first mask pattern 218 is removed by an etching process, upper portions of the preliminary inner wall oxide pattern 201*a* and the preliminary filling insulation pattern 205*a* in the preliminary isolation structure 207*a* in the second to fourth peripheral regions A2, B1, and B2 may be only etched by overetching in the etching process. Thus, etched thicknesses of the preliminary inner wall oxide pattern 201*a* and the preliminary filling insulation pattern 205*a* may be decreased. Therefore, the isolation structure 208*a* including the inner wall oxide pattern 202*a*, the nitride liner 204*a*, and the filling insulation pattern 206*a* may be formed in each of the second to fourth peripheral regions A2, B1, and B2.

In the first to fourth peripheral regions A1, A2, B1, and B2, each of the isolation structures 208*a* may include the inner wall oxide pattern 202*a* and the nitride liner 204*a* protruding from the filling insulation pattern 206*a*. An uppermost surface of the inner wall oxide pattern 202*a* may be lower than an uppermost surface of the nitride liner 204*a*. Thus, the recessed portion 222 may be formed between the nitride liner 204*a* and the substrate 100 adjacent the nitride liner 204*a*.

In the isolation structures 208*a* formed in the first to fourth peripheral regions A1, A2, B1, and B2, heights of upper surfaces of the nitride liners 204*a* may be substantially the same. In example embodiments, in the isolation structures 208*a* in the first to fourth peripheral regions A1, A2, B1, and B2, the uppermost surfaces of the nitride liners 204*a* may be substantially coplanar with an uppermost surface of the substrate 100 adjacent thereto.

In example embodiments, in the isolation structures 208*a* in the first to fourth peripheral regions A1, A2, B1, and B2, vertical levels of bottoms of the recessed portions 222 may be substantially the same.

Figure 22:
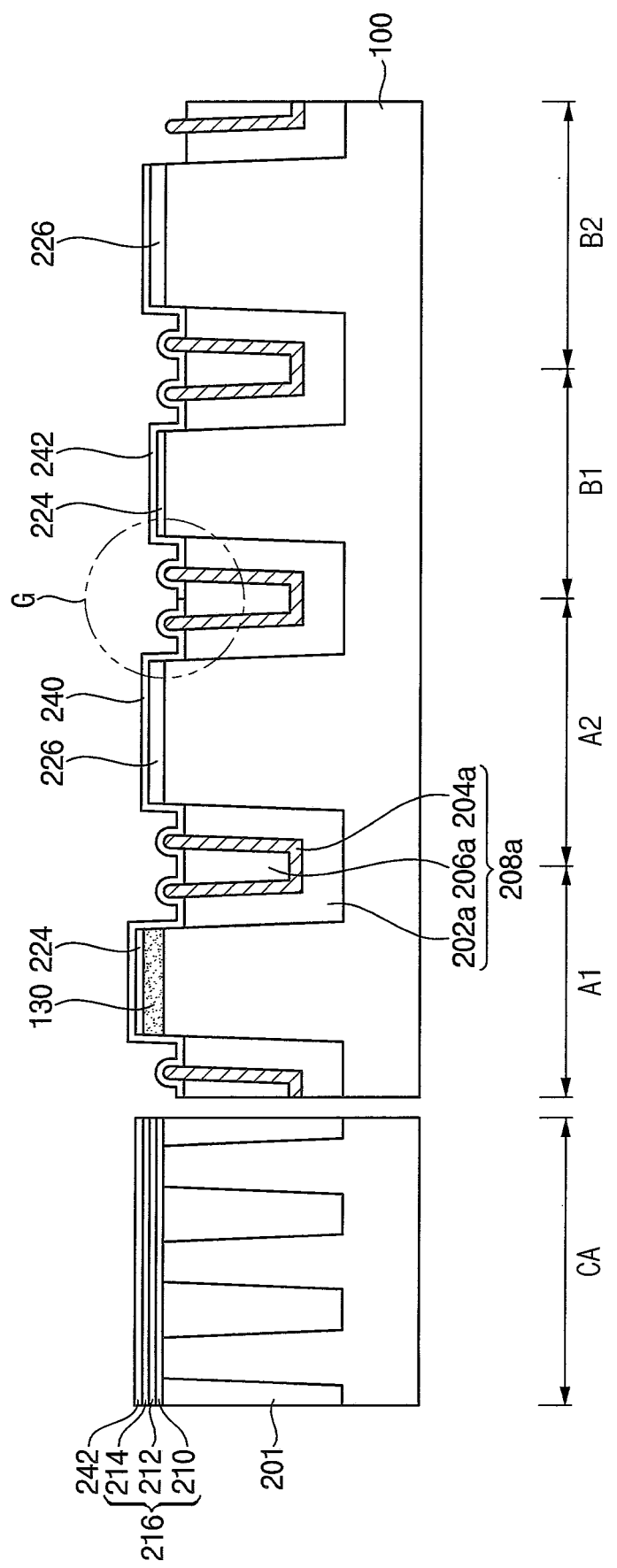
Figure 23:
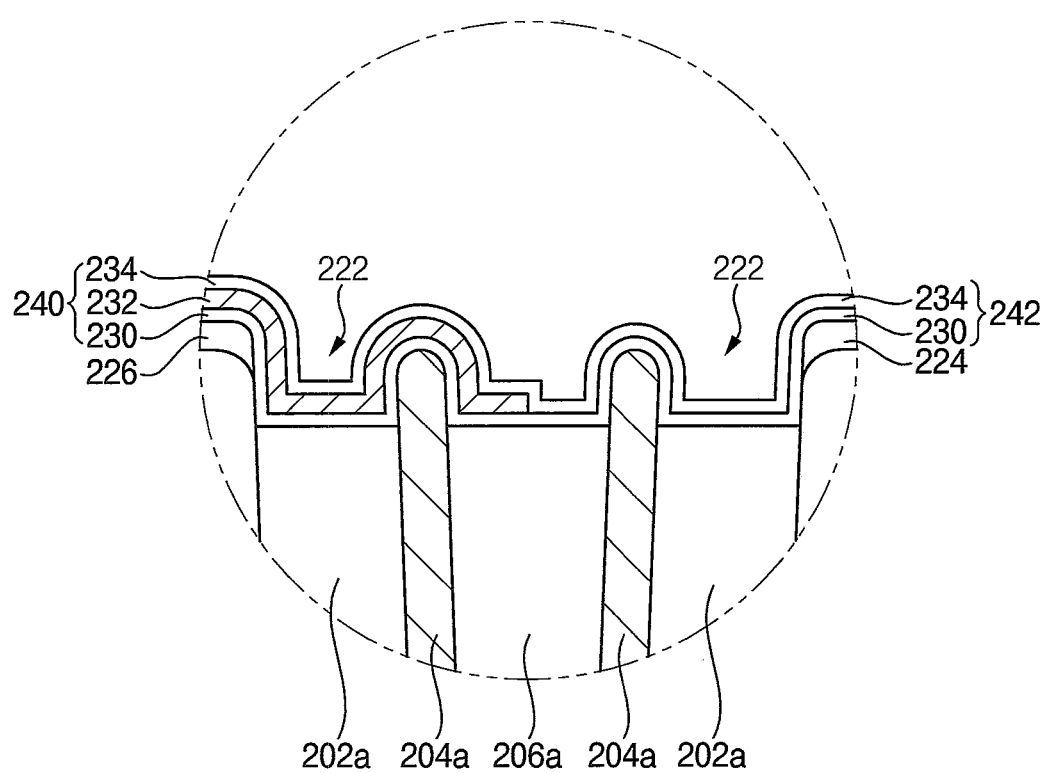

FIGS. 22 and 23, a high voltage interface insulation layer 226 may be formed on the substrate 100 of the second and fourth peripheral regions A2 and B2. The high voltage interface insulation layer 226 may be formed of, e.g., silicon oxynitride.

A low voltage interface insulation layer 224 may be formed on the substrate 100 and the channel layer 130 in the first and third peripheral regions A1 and B1. The low voltage interface insulation layer 224 may be formed of, e.g., silicon oxide. The low voltage interface insulation layer 224 may be formed to have a thickness less than a thickness of the high voltage interface insulation layer 226.

A high-k dielectric layer 230 may be conformally formed over an entire surface of the substrate 100. The high-k dielectric layer 230 may be formed by a deposition process, e.g., chemical vapor deposition (CVD) or atomic layer deposition (ALD). A P-type metal layer 232 may be conformally formed on the high-k dielectric layer 230.

A second mask pattern may be formed on the P-type metal layer 232. The second mask pattern may cover the first and second peripheral regions A1 and A2, and the second mask pattern may expose the third and fourth peripheral regions B1 and B2 and the cell array region CA. The P-type metal layer in the cell array region CA and the third and fourth peripheral regions B1 and B2 may be removed using the second mask pattern as an etching mask. Thus, the high-k dielectric layer 230 may be exposed on the cell array region CA and the third and fourth peripheral regions B1 and B2. The removing process may include wet etching. An N-type metal layer 234 may be formed on the P-type metal layer 232 and the high-k dielectric layer 230.

FIG. 23 is an enlarged view of a portion "G" of FIG. 22.

Referring to FIG. 23, the high-k dielectric layer 230, the P-type metal layer 232, and the N-type metal layer 234 may be stacked on the first and second peripheral regions A1 and A2. The high-k dielectric layer 230 and the N-type metal layer 234 may be stacked on the third and fourth peripheral regions B1 and B2.

In FIG. 22, in order to simplify the drawing, the high-k dielectric layer 230, the P-type metal layer 232, and the N-type metal layer 234 in the first and second peripheral regions A1 and A2 may be illustrated as a first layer 240, and the high-k dielectric layer 230 and the N-type metal layer 234 in the third and fourth peripheral regions B1 and B2 and the cell array region CA may be illustrated as a second layer 242. After forming the first and second layers, recessed portions 222 of the isolation structure in the first to fourth peripheral regions A1, A2, B1 and B2 may have remaining inner spaces.

Figure 24:
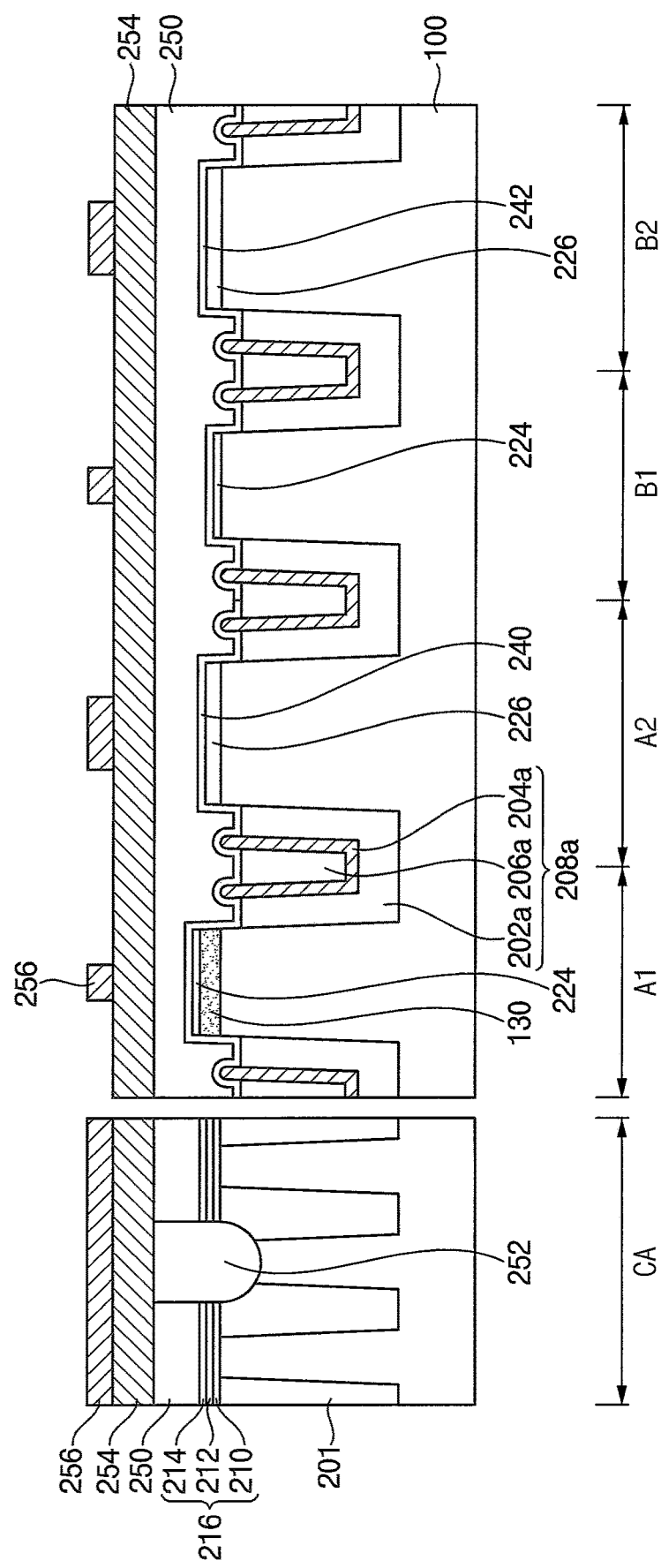

Referring to FIG. 24, a third mask pattern may be formed to cover the N-type metal layer 234 in the first to fourth peripheral regions A1, A2, B1, and B2. The third mask pattern may expose the cell array region CA. The N-type metal layer 234 and the high-k dielectric layer 230 in the cell array region CA may be removed using the third mask pattern. Then, the third mask pattern may be removed.

A lower electrode layer 250 may be formed over the entire surface of the substrate 100. Portions of the lower electrode layer 250, the buffer layer 216, and the substrate 100 in the cell array region may be etched to form a first opening. The first opening may correspond to a position for forming a bit line contact. In an etching process for forming the first opening, an upper portion of the cell isolation structure 201 may be removed together.

A polysilicon layer may be formed to fill the first opening, and the polysilicon layer may be planarized by a planarization process. Thus, a polysilicon pattern 252 may be formed in the first opening.

A barrier layer and an upper electrode layer 254 may be formed on the lower electrode layer 250 and the polysilicon pattern 252. A capping layer pattern 256 may be formed on the upper electrode layer 254. The capping layer pattern 256 may cover entire of the cell array region CA. In addition, the capping layer pattern 256 may be also disposed at portions for forming the first to fourth gate structures in the first to fourth peripheral regions A1, A2, B1, and B2.

Figure 25:
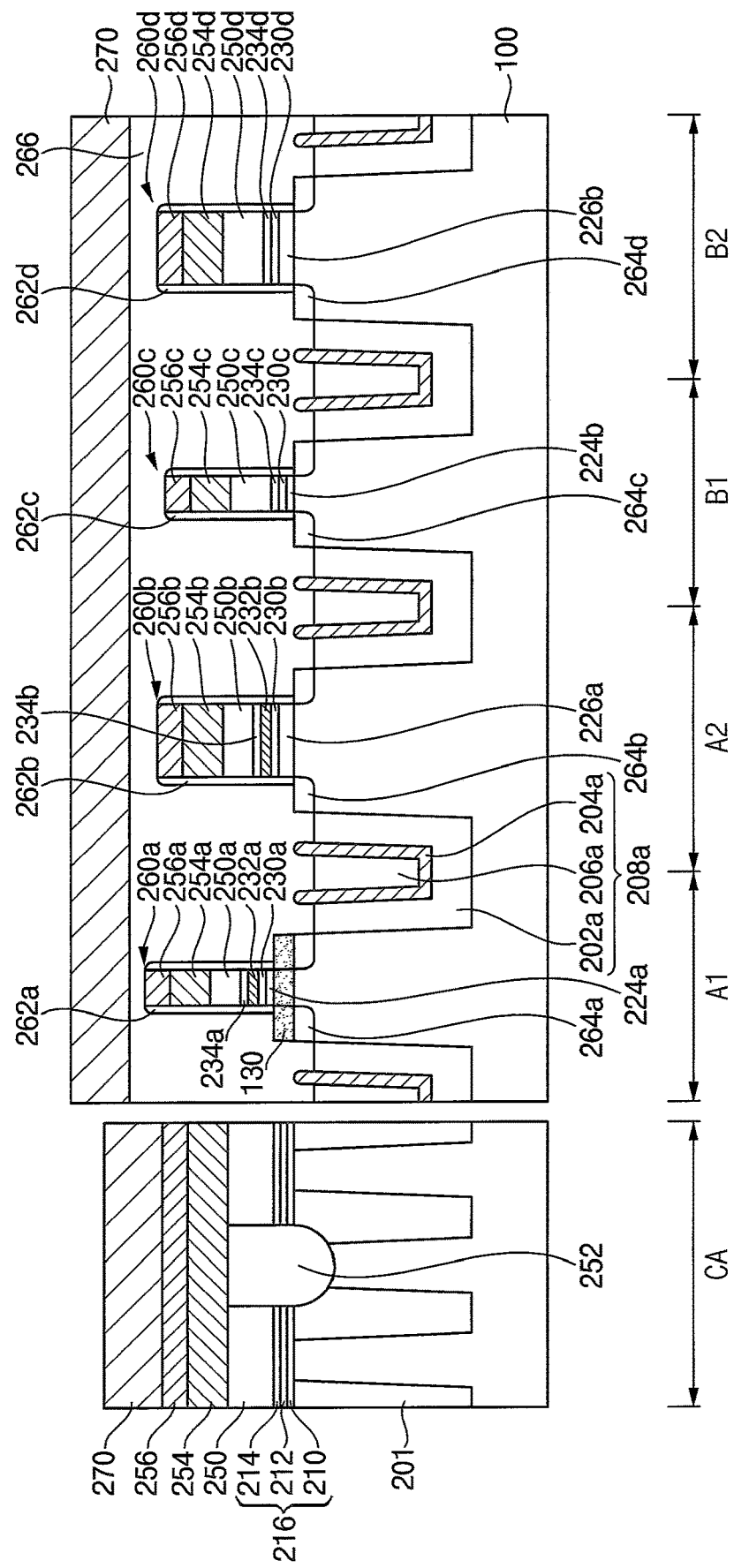

Referring to FIG. 25, the upper electrode layer 254, the barrier layer, the lower electrode layer 250, the P-type metal layer 232, the N-type metal layer 234, the high-k dielectric layer 230, the high voltage interface insulation layer 226, and the low voltage interface insulation layer 224 in the first to fourth peripheral regions A1, A2, B1 and B2 may be etched using the capping layer pattern 256 as an etching mask to form the first to fourth gate structures 260a, 260b, 260c and 260d. First to fourth spacers 262a, 262b, 262c, and 262d may be formed on sidewalls of the first to fourth gate structures 260a, 260b, 260c, and 260d, respectively.

P-type impurities may be doped onto the substrate adjacent to the sidewalls of the first and second gate structures 260a and 260b to form first and second impurity regions 264a and 264b, respectively. N-type impurities may be doped onto the substrate adjacent to the sidewalls of the third and fourth gate structures 260c and 260d to form third and fourth impurity regions 264c and 264d, respectively.

An insulating interlayer 266 may be formed on the entire surface of the substrate 100 to cover the first to fourth gate structures 260a, 260b, 260c, and 260d. An upper portion of the insulating interlayer 266 may be planarized. An upper capping layer 270 may be formed on the capping layer pattern 256 in the cell array region CA and the insulating interlayer 266 in the first to fourth peripheral regions A1, A2, B1, and B2.

Figure 26:
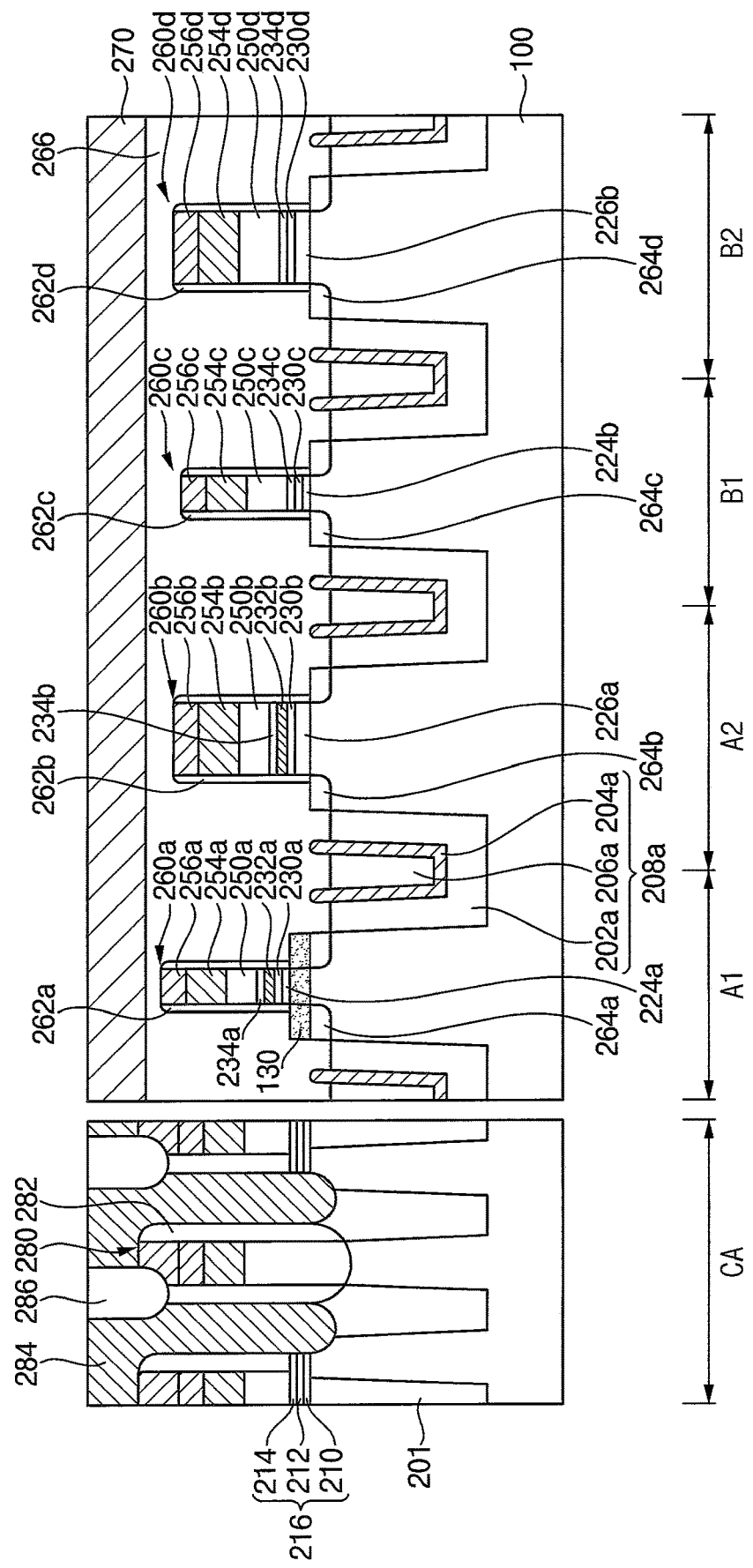

Referring to FIG. 26, the upper capping layer 270, the capping layer pattern 256, the upper electrode layer 254, the barrier layer, the lower electrode layer 250, and the polysilicon pattern 252 in the cell array region CA may be etched using a mask to form a bit line structure 280. A bit line spacer 282 may be formed on a sidewall of the bit line structure 280.

An insulation layer may be formed to fill a gap between bit line structures 280. Portions of the insulation layer and the buffer layer 216 may be etched to form a second opening exposing the surface of the substrate 100. A contact plug 284 may be formed to fill the second opening. An upper insulation pattern 286 may be formed between upper portions of adjacent contact plugs 284.

Referring to FIG. 17 again, a capacitor 290 may be formed on the contact plug 184.

As described above, the DRAM cells may be formed in the cell array region, and the low voltage PMOS transistor, the high voltage PMOS transistor, the low voltage NMOS transistor, and the high voltage NMOS transistor including the high-k dielectric layer may be formed in the first to fourth peripheral regions. At least the low voltage PMOS transistor may be formed on the channel layer including the silicon germanium.

By way of summation and review, example embodiments provide a semiconductor device having good electrical characteristics and high reliability. That is, in the semiconductor device, in accordance with example embodiments, an isolation structure may include a nitride liner having a protruding portion that defines a recessed portion with an increased width. A metal material may not remain in the recessed portion, thereby decreasing defects, e.g., due to residual metal materials in the recessed portion, in the semiconductor device.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
   a substrate including a first region and a second region;
   a first trench in the substrate, the first trench being on the first region;
   a second trench in the substrate, the second trench being on the second region;
   a first isolation structure filling the first trench, the first isolation structure including a first inner wall oxide pattern, a first liner, and a first filling insulation pattern sequentially stacked;
   a second isolation structure filling the second trench, the second isolation structure including a second inner wall oxide pattern, a second liner, and a second filling insulation pattern sequentially stacked;
   a first gate structure on the substrate, the first gate structure including a first high-k dielectric pattern, a first P-type metal pattern, and a first N-type metal pattern sequentially stacked on the first region of the substrate;
   a second gate structure on the substrate, the second gate structure including a second high-k dielectric pattern and a second N-type metal pattern sequentially stacked on the second region of the substrate,
   wherein the first inner wall oxide pattern and the first liner are conformal on a surface of the first trench, the first liner protruding above uppermost surfaces of the first inner wall oxide pattern and the first filling insulation pattern, such that a first recessed portion is defined between the first liner and a first portion of the substrate adjacent to the first liner, an inner width of the first recessed portion being greater than a height from a bottom of the first recessed portion to an uppermost surface of the first liner,
   wherein the second inner wall oxide pattern and the second liner are conformal on a surface of the second trench, the second liner protruding above uppermost surfaces of the second inner wall oxide pattern and the second filling insulation pattern, such that a second recessed portion is defined between the second liner and a second portion of the substrate adjacent to the second liner, an inner width of the second recessed portion being greater than a height from a bottom of the second recessed portion to an uppermost surface of the second liner, and
   wherein the first portion of the substrate adjacent to the first liner includes an impurity region, the first recessed portion being between the first liner and the impurity region, and the first recessed portion at least partially exposing a lateral side of the impurity region.

2. The semiconductor device as claimed in claim 1, wherein the first and second inner wall oxide patterns and the first and second filling insulation patterns include silicon oxide, and the first and second liners include silicon nitride.

3. The semiconductor device as claimed in claim 1, wherein:
   the uppermost surface of the first inner wall oxide pattern is the bottom of the first recessed portion, the entire bottom of the first recessed portion being lower than the upper surface of the first portion of the substrate adjacent to the first liner, and the uppermost surface of the second recessed portion is the bottom of the second recessed portion, the entire bottom of the second recessed portion being lower than the upper surface of the second portion of the substrate adjacent to the second liner.

4. The semiconductor device as claimed in claim 3, wherein the uppermost surface of the first inner wall oxide pattern and the uppermost surface of the second inner wall oxide pattern are substantially coplanar with each other.

5. The semiconductor device as claimed in claim 1, wherein the first inner wall oxide pattern has a thickness of 200 angstroms or more in a vertical direction from the surface of the first trench, and the second inner wall oxide pattern has a thickness of 200 angstroms or more in the vertical direction from the surface of the second trench.

6. The semiconductor device as claimed in claim 1, wherein an uppermost surface of the first liner is substantially coplanar with an upper surface of a first portion of the substrate adjacent to the first liner, and an uppermost surface of the second liner is substantially coplanar with an upper surface of a second portion of the substrate adjacent to the second liner.

7. The semiconductor device as claimed in claim 1, wherein heights of the uppermost surfaces of the first and second liners are substantially the same.

8. The semiconductor device as claimed in claim 1, further comprising a channel layer including silicon germanium on the first region of the substrate, the first gate structure being on the channel layer.

9. The semiconductor device as claimed in claim 1, wherein:
the entire bottom of the first recessed portion between facing surfaces of the first liner and the first portion of the substrate adjacent to the first liner is flat, and
the entire bottom of the second recessed portion between facing surfaces of the second liner and the second portion of the substrate adjacent to the second liner is flat.

10. A semiconductor device, comprising:
a substrate including a cell array region, a first peripheral region, and a second peripheral region;
memory cells on the cell array region of the substrate;
trenches in the first and second peripheral regions of the substrate;
an isolation structure filling each of the trenches, the isolation structure including an inner wall oxide pattern, a nitride liner, and a filling insulation pattern sequentially stacked;
a channel layer in the first peripheral region of the substrate, the channel layer including silicon germanium;
a first gate structure on the channel layer, the first gate structure including a first high-k dielectric pattern, a first P-type metal pattern, and a first N-type metal pattern sequentially stacked; and
a second gate structure on the second peripheral region of the substrate, the second gate structure including a second high-k dielectric pattern and a second N-type metal pattern sequentially stacked,
wherein the inner wall oxide pattern and the nitride liner are conformal on surfaces of each of the trenches, the nitride liner protruding above upper surfaces of the inner wall oxide pattern and the filling insulation pattern, such that a recessed portion is defined between the nitride liner and the substrate, and an inner width of the recessed portion being greater than a height from a bottom of the recessed portion to an uppermost surface of the nitride liner, and
wherein a first portion of the substrate adjacent to the nitride liner includes an impurity region, the first portion being between the nitride liner and the impurity region, and the recessed portion at least partially exposing a lateral side of the impurity region.

11. The semiconductor device as claimed in claim 10, wherein the memory cells include dynamic random-access memory (DRAM) cells, the DRAM cells including bit line structures.

12. The semiconductor device as claimed in claim 11, wherein each of the bit line structures includes a first structure having a polysilicon pattern, a metal pattern, and a capping pattern, the first structure being on the first N-type metal pattern of the first gate structure, and on the second N-type metal pattern of the second gate structure.

13. The semiconductor device as claimed in claim 10, wherein the inner wall oxide pattern has a thickness of 200 angstroms or more in a vertical direction from surfaces of each of the trenches.

14. The semiconductor device as claimed in claim 10, wherein an uppermost surface of the nitride liner is coplanar with an upper surface of a portion of the substrate adjacent to the nitride liner.

15. A semiconductor device, comprising:
a substrate including a cell array region, a first peripheral region, a second peripheral region, a third peripheral region, and a fourth peripheral region;
memory cells on the cell array region of the substrate;
trenches on first to fourth peripheral regions of the substrate;
an isolation structure filling each of the trenches, the isolation structure including an inner wall oxide pattern, a nitride liner, and a filling insulation pattern sequentially stacked;
a channel layer on the first peripheral region of the substrate, the channel layer including silicon germanium;
a first gate structure on the channel layer, the first gate structure including a first interface insulation pattern, a first high-k dielectric pattern, a first P-type metal pattern, and a first N-type metal pattern sequentially stacked;
a second gate structure on the second peripheral region of the substrate, the second gate structure including a second interface insulation pattern, a second high-k dielectric pattern, a second P-type metal pattern, and a second N-type metal pattern sequentially stacked, and a thickness of the second interface insulation pattern being greater than a thickness of the first interface insulation pattern;
a third gate structure on the third peripheral region of the substrate, the third gate structure including a third interface insulation pattern, a third high-k dielectric pattern, and a third N-type metal pattern sequentially stacked; and
a fourth gate structure on the fourth peripheral region of the substrate, the fourth gate structure including a fourth interface insulation pattern, a fourth high-k dielectric pattern, and a fourth N-type metal pattern sequentially stacked,
wherein the nitride liner is conformal on surfaces of each of the trenches, the nitride liner protruding above upper surfaces of the inner wall oxide pattern and the filling insulation pattern, and a height of an uppermost surface of the nitride liner is substantially the same in each of the trenches, and wherein a plurality of the nitride liner have protruding portions from the upper surfaces of the inner wall oxide pattern, respectively, heights of the protruding portions being substantially the same as each other.

16. The semiconductor device as claimed in claim 15, wherein the memory cells include dynamic random-access memory (DRAM) cells, the DRAM cells including bit line structures.

17. The semiconductor device as claimed in claim 15, wherein the inner wall oxide pattern has a thickness of 200 angstroms or more in a vertical direction from a surface of each of the trenches.

18. The semiconductor device as claimed in claim 15, wherein, in the isolation structure in each of the first to fourth peripheral regions, an uppermost surface of the inner wall oxide pattern extends to a same height.

19. The semiconductor device as claimed in claim 1, wherein a height of a protruding portion of the first liner is substantially the same as a height of a protruding portion of the second liner.

20. The semiconductor device as claimed in claim 10, wherein a plurality of the nitride liner have protruding portions from the upper surfaces of the inner wall oxide pattern, respectively, heights of the protruding portions being substantially the same as each other.

* * * * *